(12) United States Patent
Gardner et al.

(10) Patent No.: US 12,218,011 B2
(45) Date of Patent: Feb. 4, 2025

(54) METHOD OF MAKING 3D SEGMENTED DEVICES FOR ENHANCED 3D CIRCUIT DENSITY

(71) Applicant: Tokyo Electron Limited, Tokyo (JP)

(72) Inventors: Mark Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 737 days.

(21) Appl. No.: 17/521,279

(22) Filed: Nov. 8, 2021

(65) Prior Publication Data

US 2022/0359294 A1 Nov. 10, 2022

Related U.S. Application Data

(60) Provisional application No. 63/186,063, filed on May 7, 2021.

(51) Int. Cl.
| | |
|---|---|
| *H01L 21/82* | (2006.01) |
| *H01L 21/8238* | (2006.01) |
| *H01L 27/02* | (2006.01) |
| *H01L 27/06* | (2006.01) |
| *H01L 27/092* | (2006.01) |
| *H01L 29/66* | (2006.01) |
| *H01L 29/78* | (2006.01) |

(52) U.S. Cl.
CPC ...... *H01L 21/8238* (2013.01); *H01L 27/0207* (2013.01); *H01L 27/0688* (2013.01); *H01L 27/092* (2013.01); *H01L 29/66666* (2013.01); *H01L 29/7827* (2013.01)

(58) Field of Classification Search
CPC ............. H01L 21/8238; H01L 27/0207; H01L 27/0688; H01L 27/092; H01L 29/66666; H01L 29/7827; H01L 21/8221; H01L 21/823807; H01L 21/823885; H01L 29/78642
USPC ......................................................... 438/212
See application file for complete search history.

(56) References Cited

U.S. PATENT DOCUMENTS

| | | | |
|---|---|---|---|
| 2019/0139982 A1* | 5/2019 | Hu | .................. H10B 43/35 |
| 2020/0243555 A1* | 7/2020 | Hu | .................. H01L 29/40117 |
| 2021/0175354 A1* | 6/2021 | Balakrishnan | .............................. H01L 21/823864 |

* cited by examiner

*Primary Examiner* — Mohammad M Hoque
(74) *Attorney, Agent, or Firm* — Oblon, McClelland, Maier & Neustadt, L.L.P.

(57) ABSTRACT

A method of microfabrication includes forming an initial vertical channel structure of semiconductor material protruding from a surface of a substrate such that the initial vertical channel structure has a current flow path that is perpendicular to the surface of the substrate. The initial vertical channel structure is segmented lengthwise into a plurality of independent vertical channel structure segments, each vertical channel structure segment having a respective current flow path that is perpendicular to the surface of the substrate.

20 Claims, 22 Drawing Sheets

METHOD OF MAKING 3D SEGMENTED DEVICES FOR ENHANCED 3D CIRCUIT DENSITY

CROSS REFERENCE TO RELATED APPLICATIONS

The present application claims the benefit of U.S. Prov. Ser. No. 63/186,063, entitled "Method Of Making 3D Segmented Devices For Enhanced 3D Circuit Density", filed on May 7, 2021 and incorporated herein by reference in its entirety.

BACKGROUND OF THE INVENTION

Field of the Invention

This disclosure relates to microelectronic devices including semiconductor devices, transistors, and integrated circuits, including methods of microfabrication.

Description of the Related Art

The background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is a subject of research.

Accordingly, it is an object of the present disclosure to provide methods for manufacturing a 3D semiconductor having stacked transistors and semiconductor devices in which vertical channels are segmented into multiple channels to achieve multiple field effect transistors. Further, higher density circuits can be produced at reduced cost.

SUMMARY

Aspects of the present disclosure include methods and devices for forming vertical channel field effect transistors by dividing or segmenting vertical channels into multiple channels for multiple field effect transistors. Using a 3D vertical segmentation of silicon transistor regions, the density of circuits can be increased by 2 times to N times per transistor level, N being equal to the number of divisions. The 3D segmented transistor herein can be applied to any 3D vertical transistor design for increasing the circuit layout density.

An aspect (1) provides a method of microfabrication, the method comprising: forming a layer stack on a substrate, the layer stack including alternating layers of a metal and a first dielectric material; and forming openings in the layer stack that extend vertically through the layer stack and uncover an underlying layer of semiconductor material. Vertical channel structures are formed extending through the openings of the layer stack, the vertical channel structures formed by epitaxial growth and the vertical channel structures each having a current flow path that is perpendicular to a surface of the substrate. Each of the vertical channel structures is segmented lengthwise into a plurality of vertical channel structure segments, each vertical channel structure segment having a current flow path that is perpendicular to the surface of the substrate. Portions of the layers of the metal are used to electrically connect to the vertical channel structure segments.

Aspect (2) provides the method of aspect (1), wherein the forming vertical channel structures extending through openings of the layer stack includes forming stacks of vertical channel structures positioned over each other in a direction perpendicular to the surface of the substrate.

An aspect (3) includes the method of aspect (1), wherein the portions of the layers of the metal are used to form source/drain contacts and gate contacts to each vertical channel structure segment, with source/drain contacts positioned above and below a respective gate contact for forming the current flow path that is perpendicular to the surface of the substrate.

Another aspect (4) provides a method of microfabrication, the method including forming an initial vertical channel structure of semiconductor material protruding from a surface of a substrate such that the initial vertical channel structure has a current flow path that is perpendicular to the surface of the substrate. The initial vertical channel structure is segmented lengthwise into a plurality of independent vertical channel structure segments, each vertical channel structure segment having a respective current flow path that is perpendicular to the surface of the substrate.

An aspect (5) provides the method of aspect (4), wherein the forming an initial vertical channel structure comprises epitaxially growing a solid core of silicon-containing material from the substrate surface as the initial vertical channel structure.

An aspect (6) provides the method of aspect (4), wherein the forming an initial vertical channel structure includes epitaxially growing a solid core of silicon-containing material from the substrate surface, and etching a core opening contained within an inner portion of the solid core to form a shell of silicon-containing material as the initial vertical channel structure.

An aspect (7) provides the method of aspect (6), further comprising forming a conformal layer of high-k dielectric material within the core opening.

An aspect (8) provides the method of aspect (4), further comprising forming an initial gate structure on the initial vertical channel structure, wherein the segmenting further comprises segmenting the initial gate structure lengthwise into a plurality of gate structure segments associated with the plurality of vertical channel structure segments respectively.

An aspect (9) provides the method of aspect (8), wherein the forming the initial gate structure comprises forming the initial gate structure at an intermediate stage of epitaxially growing the initial vertical channel structure.

An aspect (10) provides the method of aspect (4), further comprising forming an initial source/drain contact for the initial vertical channel structure, wherein the segmenting further comprises segmenting the initial source/drain contact lengthwise into a plurality of source/drain contact segments associated with the plurality of vertical channel structure segments respectively.

An aspect (11) provides the method of claim (10), wherein the forming the initial source/drain contact comprises forming the initial source/drain contact at an intermediate stage of epitaxially growing the initial vertical channel structure.

An aspect (12) provides the method of claim (4), further comprising forming an initial isolation structure which separates the initial vertical channel structure from the substrate, wherein the segmenting further comprises segmenting the initial isolation structure lengthwise into a plurality of isolation structure segments each separating a respective vertical channel structure segment from the substrate.

An aspect (13) provides the method of claim (12), wherein the segmenting comprises directionally etching a division opening lengthwise through the initial vertical channel structure and the initial isolation structure to expose a portion of the substrate beneath the initial vertical channel structure, wherein the division opening segments the initial vertical channel structure and the initial isolation structure into the plurality of isolation structure segments each separating a respective vertical channel structure segment from the substrate.

An aspect (14) provides the method of claim (13), further comprising isotropically etching each of the isolation segments through the division opening to form an isolation air gap which separates each of the vertical channel structure segments from the substrate.

An aspect (15) provides the method of claim (14), further comprising filling the division opening and the isolation air gap with dielectric material which separates each of the vertical channel structure segments from the substrate.

An aspect (16) provides the method of claim (4), wherein the forming an initial vertical channel structure comprises forming an initial stack of vertical channel structures comprising a plurality of initial vertical channel structures stacked in the direction perpendicular to the surface of the substrate. The segmenting of this aspect includes segmenting the initial stack of vertical channel structures lengthwise into a plurality of segmented stacks of vertical channel structures.

An aspect (17) provides the method of claim (16), further comprising forming an initial isolation structure for the initial stack of vertical channel structures, wherein the segmenting further comprises segmenting the initial isolation structure lengthwise into a plurality of segmented isolation structures each corresponding to a respective segmented stack of vertical channel structures.

An aspect (18) provides the method of claim (17), wherein the initial isolation structure comprises a first isolation portion which separates the plurality of initial vertical channel structures from each other, and a second isolation portion which separates the initial stack of vertical isolation structures from the substrate. The segmenting the initial isolation structure comprises segmenting each of the first and second isolation portions into first portion segments which separate the vertical channel structures of a respective segmented stack from each other, and second portion segments which separate a respective segmented stack of vertical channel structures from the substrate.

An aspect (19) provides the method of claim (18), wherein the segmenting comprises directionally etching a division opening lengthwise through the initial vertical channel structure and the initial isolation structure to expose a portion of the underlying substrate. The method further comprising isotropically etching each of the isolation segments through the division opening to form a first isolation air gap from the first isolation portion and a second isolation air gap from the second isolation portion.

An aspect (20) provides the aspect of claim (19), further comprising filling the division opening, the first isolation air gap, and the second isolation air gap with dielectric material to separate all of the stacked vertical channel structure segments from the substrate, and to separate all of the segmented vertical channel structures from each other.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
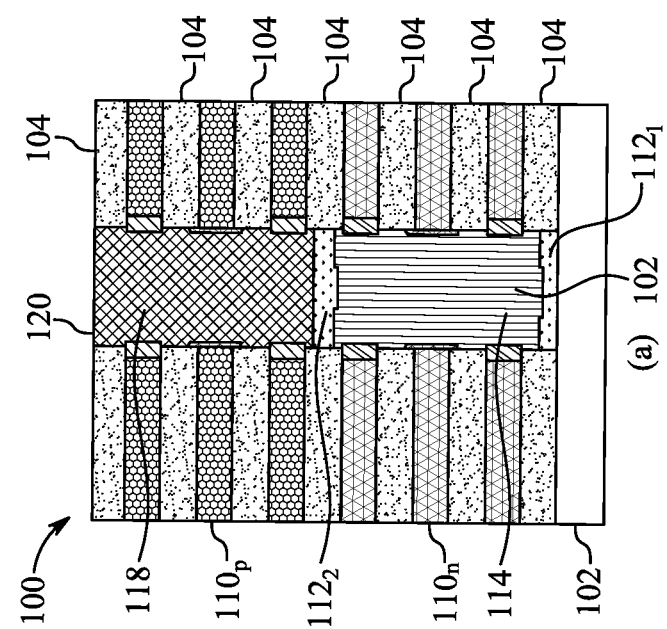
FIG. 1A illustrates a nearly finished transistor stack, where (a) is a cross-sectional view and (b) is a top view.

Referring now to the drawings, wherein like reference numerals designate identical or corresponding parts throughout the several views. Techniques herein include methods and devices for forming vertical channel field effect transistors (VFETs). Techniques include dividing or segmenting vertical channels into multiple channels for multiple field effect transistors. This enables higher density circuits to be produced at reduced cost. By using 3D vertical segmented silicon transistor regions, the density of circuits can be increased by 2 times to N times per transistor level, N being equal to the number of divisions. The 3D segmented transistor herein can be applied to any 3D vertical transistor design for increasing the circuit layout density.

The figures illustrate three alternative example process flows. A first example process flow has N=2 divisions starting with a solid epi core and starting with a nearly finished transistor with SiGe still in the stack and 3D isolation not yet completed. The first flow provides for a 2 times increase in the number of transistors and produces silicon transistor designs having a 180 degree arc shape. Another example process flow has N=4 divisions starting with a solid epi core and nearly finished transistor, and producing four devices for a 4 times increase in the number of transistors with silicon transistor designs having a 90 degree arc shape. Another example process flow has N=2 divisions starting with a cylindrical shell of epi with dielectric core producing a pair of devices for a 2 times increase in the number of transistors, starting with a transistor that does not have the isolation completed. In some embodiments, isolation of vertical channel structures within a stack may be completed before division of the vertical channel structures into two or more adjacent vertical channel structures.

The number of divisions, N, is limited only by structural considerations, such as structural stability, channel thickness, quantum effects, and the like. Note that N divisions or segmentations are contemplated herein to achieve greater density per transistor level. 3D wiring is realized with several options achieved with several invention flows. The 3D (stacked) segmented transistor technique can be applied to any 3D vertical transistor design for increasing the circuit layout density.

Figure 1B:
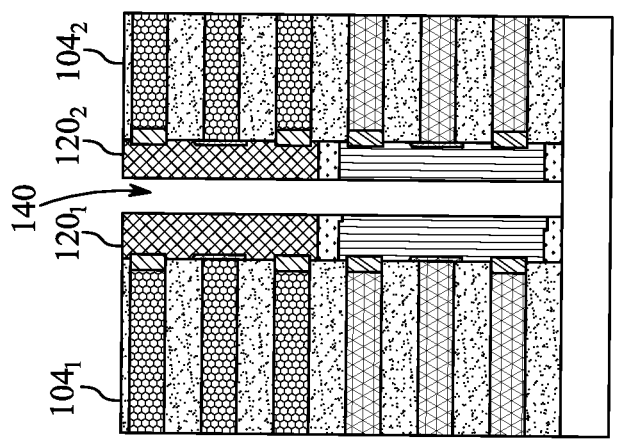
FIG. 1B illustrates the transistor stack segmented to form two transistor stacks of 180 degrees arc length, where (a) is a cross-sectional view and (b) is a top view.
Figure 1C:
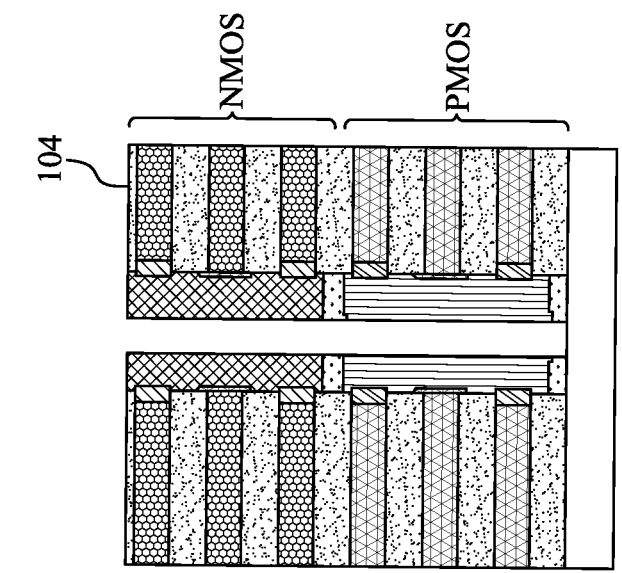
FIG. 1C illustrates the transistor stack segmented to form four transistor stacks of 90 degrees arc length, where (a) is a cross-sectional view and (b) is a top view.

FIGS. 1A, 1B and 1C show an overview of techniques herein. In these figures, view (a) provides side cross sectional substrate segments, while view (b) provides top views of the structure. In FIG. 1A, (a) shows an example of a nearly finished transistor stack 100, which is a stack of two 3D vertical transistors completed through salicidation having an NMOS transistor on top of a PMOS transistor, in which 3D isolation is not yet completed. Alternatively, the stack may include PMOS over NMOS, or each transistor in the stack may be of the same type. The nearly finished transistor stack 100 has a deposit of SiGe $112_1$ which was grown at the bottom of the vertical channel stack 120 and a deposit of SiGe $112_2$ which was grown between epitaxially grown p-silicon 114 and n-silicon 118. The SiGe regions are later removed to isolate the vertical channels from one another and from the layer of silicon substrate 102. Dielectric layers 104 isolate metal layers $110_n$, which separate the drain, gate and source metal layers of a PMOS transistor from each other, and metal layers $110_p$, which separate the drain, gate and source metal layers of the NMOS transistor from each other. Metal layers $110_p$ and $110_n$ may be of the same metal or different metals. Segmenting a vertical 3D transistor into multiple transistors greatly increases the circuit density. Division is lengthwise or perpendicular with respect to a surface of the wafer. Note that the axis of the semiconductor can be split at any angle. A circular geometry is shown in FIGS. 1A-1C, but any geometrical shape can be used. The segmentation methods of the present disclosure are not limited to the example transistor stack of FIGS. 1A-1C and may be utilized for a single level vertical transistor and for any type of 3D transistor type.

FIG. 1B shows a device segmented in half (180°) along a plane 140 perpendicular to the cross-section, yielding four transistors, (e.g., two PMOS and two NMOS), for a two times density increase. A directional (anisotropic etch) is used to etch through the vertical channel stack. A first transistor stack has vertical channel stack $120_1$ with dielectric isolation $104_1$. A second transistor stack has vertical channel stack $120_2$ with dielectric isolation $104_2$.

FIG. 1C shows a segmented device with a two axis split (90°), yielding eight transistors (four transistors at each level). In FIG. 1C, cutting plane $140_1$ is shown as perpendicular to cutting plane $140_2$, yielding equal transistor sections, however the cutting planes may be at an angle, such that the resulting transistors have different arc shapes. For example, the cutting planes may be at 60°/120° orientations, yielding two NMOS and two PMOS transistors of radial arc 60° and two NMOS and two PMOS transistors of radial arc 120°. With a stacked transistor (NMOS over PMOS, or PMOS over NMOS, or the like) this results in 4 NMOS transistors and 4 PMOS transistors, resulting in a four times density increase by increasing the planar density from two transistors (FIG. 1A (b)) to eight transistors (FIG. 1C (b)).

Figure 2:
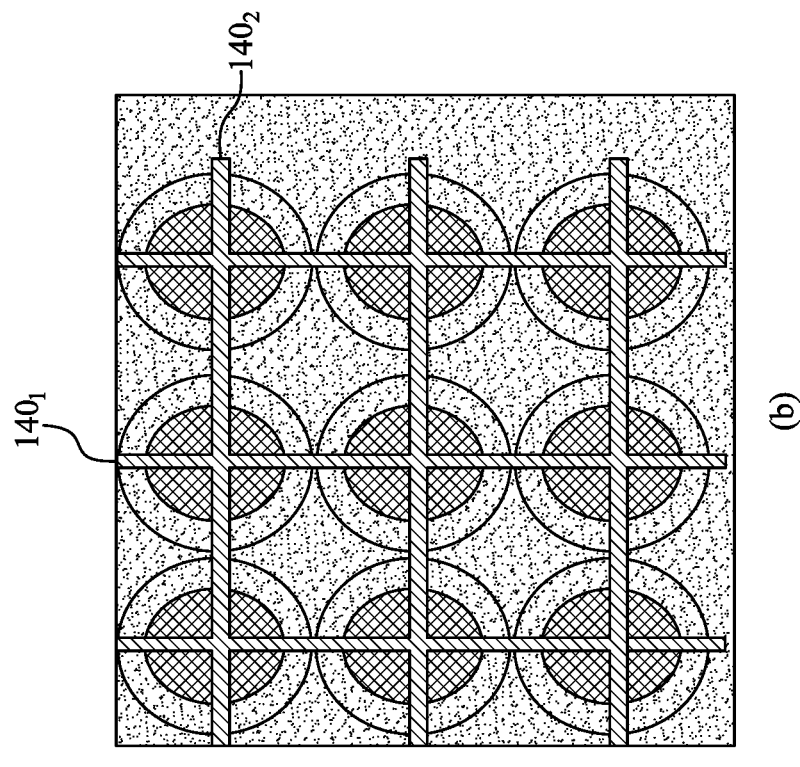
FIG. 2 illustrates (a) an array of bifurcated solid core vertical transistors, and (b) an array of quartered solid core vertical transistors.
Figure 2:
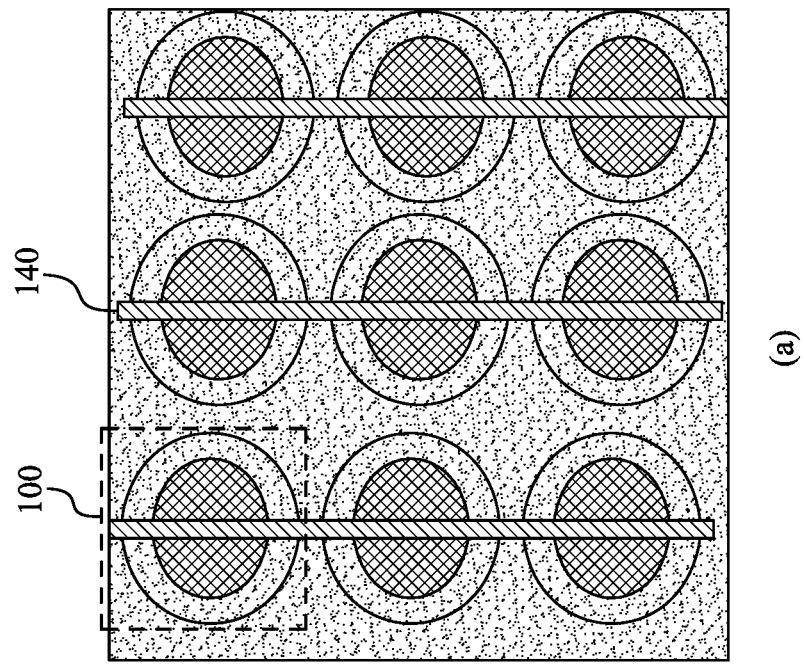

FIG. 2 illustrates a solid core epitaxially grown array of vertical transistors 100, top view. In FIG. 2, (a) shows each vertical channel or stack of vertical channels is etched to bifurcate the vertical transistor stacks along one axis by continuous cutting plane 140. In FIG. 2, (b) shows the vertical channel stack arrays quartered along two axes by continuous cutting planes $140_1$ and $140_2$ resulting in four vertical transistor stacks from each original one transistor stack.

Figure 3:
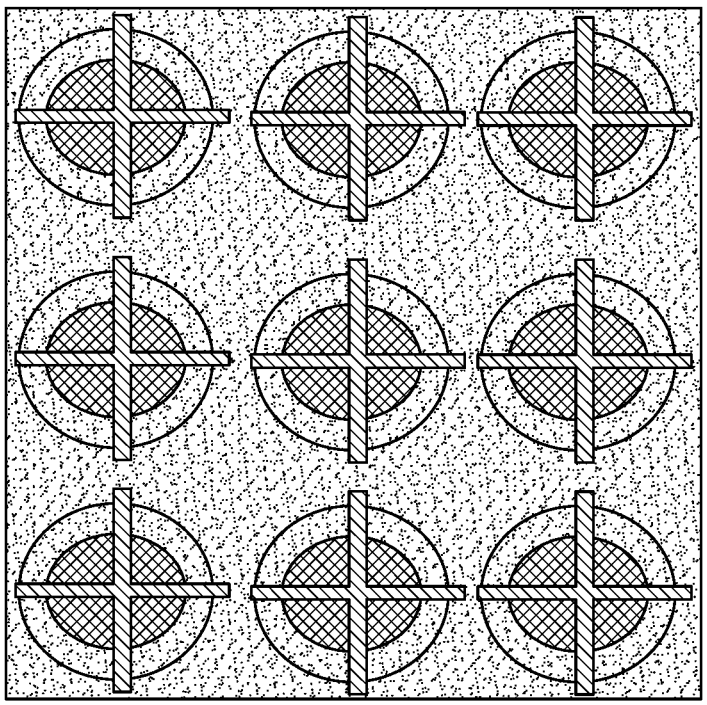
FIG. 3 illustrates (a) an array of individually bifurcated solid core vertical transistors, and (b) an array of individually quartered solid core vertical transistors.
Figure 3:
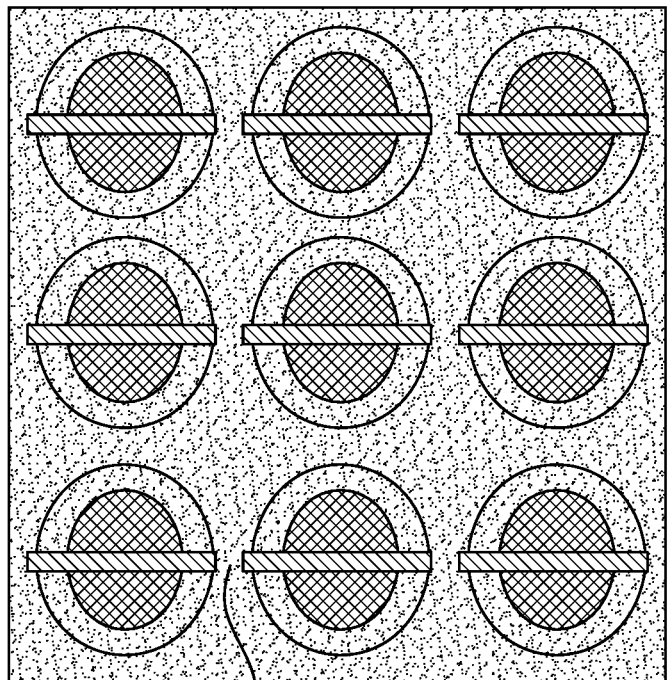

FIG. 3 is similar to FIG. 2, except that there are breaks 342 in the cutting planes (breaks in the etch mask) between adjacent transistor stacks. This allows pass through wiring on the cut side as an option. FIG. 3 illustrates a) an array of individually bifurcated solid core vertical transistors, and b) an array of individually quartered solid core vertical transistors.

Figure 4:
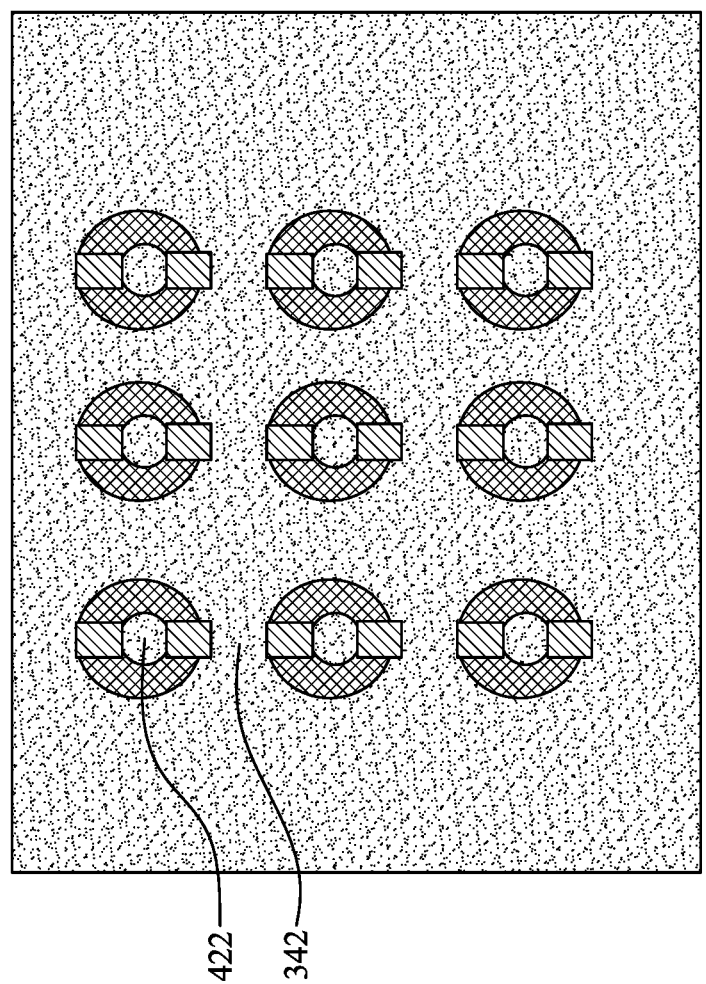
FIG. 4 illustrates vertical transistors with vertical channels filled with dielectric before segmenting.

FIG. 4 illustrates that the vertical channels can be formed as shells or cylinders (hollowed core, filled with dielectric 422) which are then divided into a desired number of segments. With the break 342 in the cut line between adjacent transistor stacks, pass-through wiring on the cut side is enabled as an option.

Figure 5:
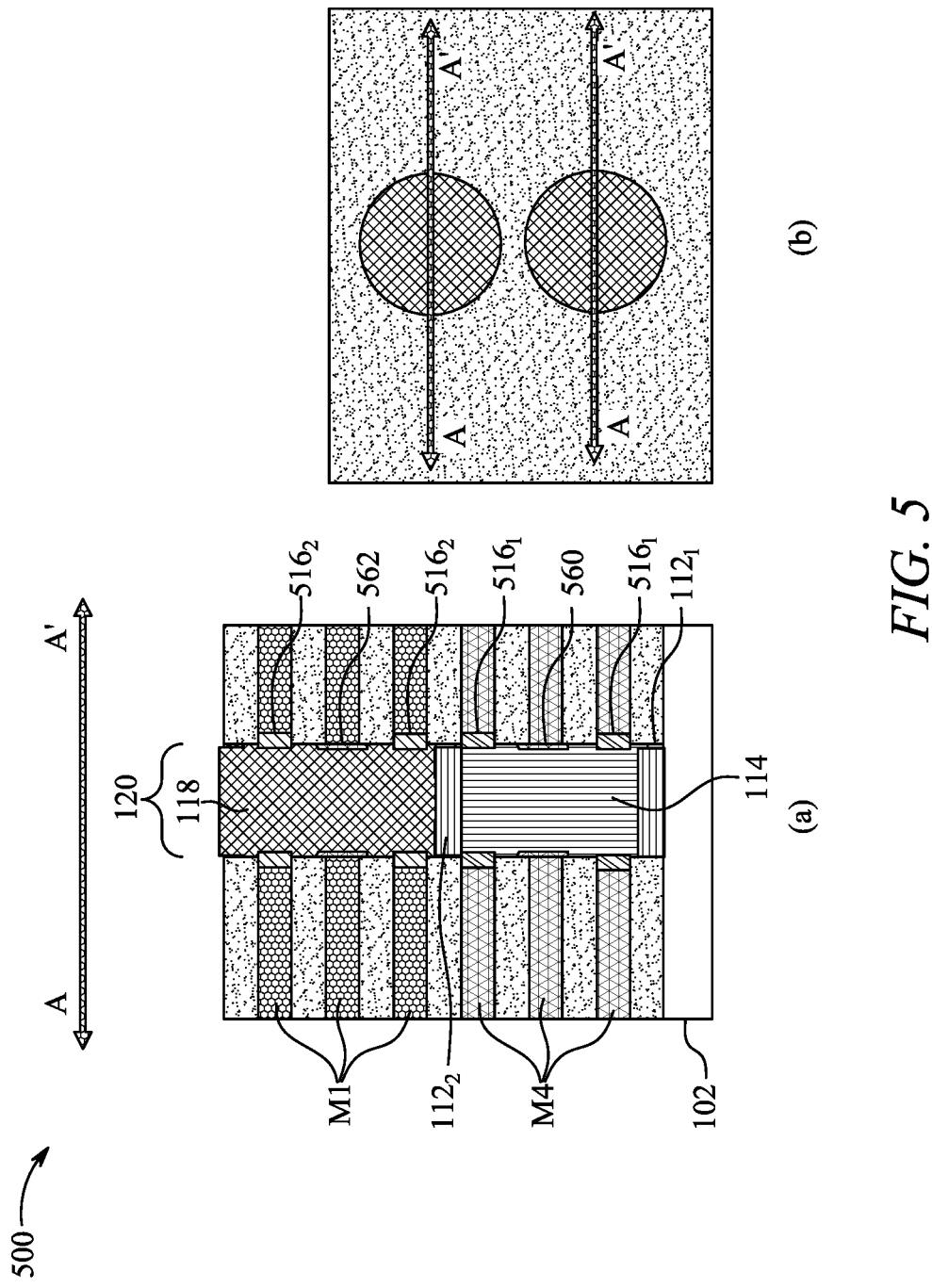
FIG. 5 illustrates a nearly finished transistor stack, where (a) is a cross-sectional view and (b) is a top view of an array of nearly finished transistors.

FIG. 5 to FIG. 9 illustrate fabrication of a first process flow for two divisions starting with a solid epitaxially grown core forming the vertical channel stack 120. A layer stack of alternating layers is formed on a substrate. The layers within the stack can include one or more types of metals and one or more types of dielectrics, with each material being etch selective to each other. In this example, there are two sub-stacks. The lower sub-stack has metal 4 (M4) lines for source, drain and gate connections. The upper sub-stack has metal 1 (M1) lines for source, drain, and gate connections. Note that layers in line with source/drain and gate connections can initially be dielectric materials which are later replaced with metal as shown. Metal 1 and metal 4 can be the same or a different metal can be used for each sub-stack. In one example of forming the core or vertical channel stack 120, an opening is etched into the layer stack until uncovering an underlying layer of silicon, which could be the bulk silicon substrate 102 of a wafer. Then vertical channel structures and sacrificial spacer layers are epitaxially grown within the openings to form the vertical channel stack 120. The sacrificial spacer layers may be a SiGe layer $112_1$ shown between the substrate 102 and the p-silicon epitaxial material 114, and a SiGe layer $112_2$ shown between the p-silicon epitaxial material 114 and the n-silicon epitaxial material 118. At particular layers during epitaxial growth of the p-silicon epitaxial material 114 and the n-silicon epitaxial material 118, metal silicide $516_1$, $516_2$ and high-k gate materials 560, 562 can be deposited at interfaces with corresponding layers of the layer stack. In FIG. 5, (a) shows a side cross-sectional view of a transistor stack along cross-sectional line A, A', and (b) shows a top view of an array of transistor stacks, each stack cut along line A, A'.

Each dielectric layer of a substack may be of a material which can be etched without etching other dielectric materials and metals. Such etch selectivity of materials is generally known in semiconductor manufacturing. Non-limiting examples of dielectric materials are silicon dioxide ($SiO_2$), titanium dioxide ($TiO_2$), silicon nitride ($Si_3N_4$), silicon oxynitride ($Si_2N_2O$), silicon carbide (SiC), or variations thereof such as $Si_xO_y$, $Si_xN_y$, and $SiO_xN_y$. High-K materials, such as oxynitrides, $O_xN_y$ may also be used as a dielectric herein.

Metal 1 and metal 4 can be selected from a group including ruthenium (Ru), tantalum (Ta), titanium (Ti), tungsten (W), gallium (Ga), gadolinium (Gd), molybdenum (Mo), aluminum (Al), copper (Cu) or combinations thereof. Variations such as tantalum nitride (TaN), titanium nitride (TiN), titanium carbide (TiC), titanium oxynitride (TiON), tantalum silicon nitride (TaSiN), titanium silicon nitride (TiSiN) and tungsten nitride (WN) may also be used.

High-K dielectrics may be selected from the group including aluminum oxide ($Al_2O_3$), aluminum nitride (AlN), zirconium dioxide ($ZrO_2$), hafnium dioxide ($HfO_2$), hafnium silicates ($HfSiO_x$), zirconium silicates (ZrSiOx), hafnium oxynitrides (HfOxNy), zirconium oxynitrides (ZrOxNy), hafnium zirconium nitrides (HfxZryOz), tantalum oxide ($Ta_2O_5$) lanthanum oxide ($La_2O_3$) yttrium oxide ($Y_2O_3$), niobium pentoxide ($Nb_2O_5$) titanium oxide ($TiO_2$) praseodymium(III) oxide ($Pr_2O_3$) gadolinium(III) oxide ($Gd_2O_3$) silicon boron nitride (SiBN), boron carbon nitride (BCN), hydrogenated boron carbide and the like.

Figure 6:
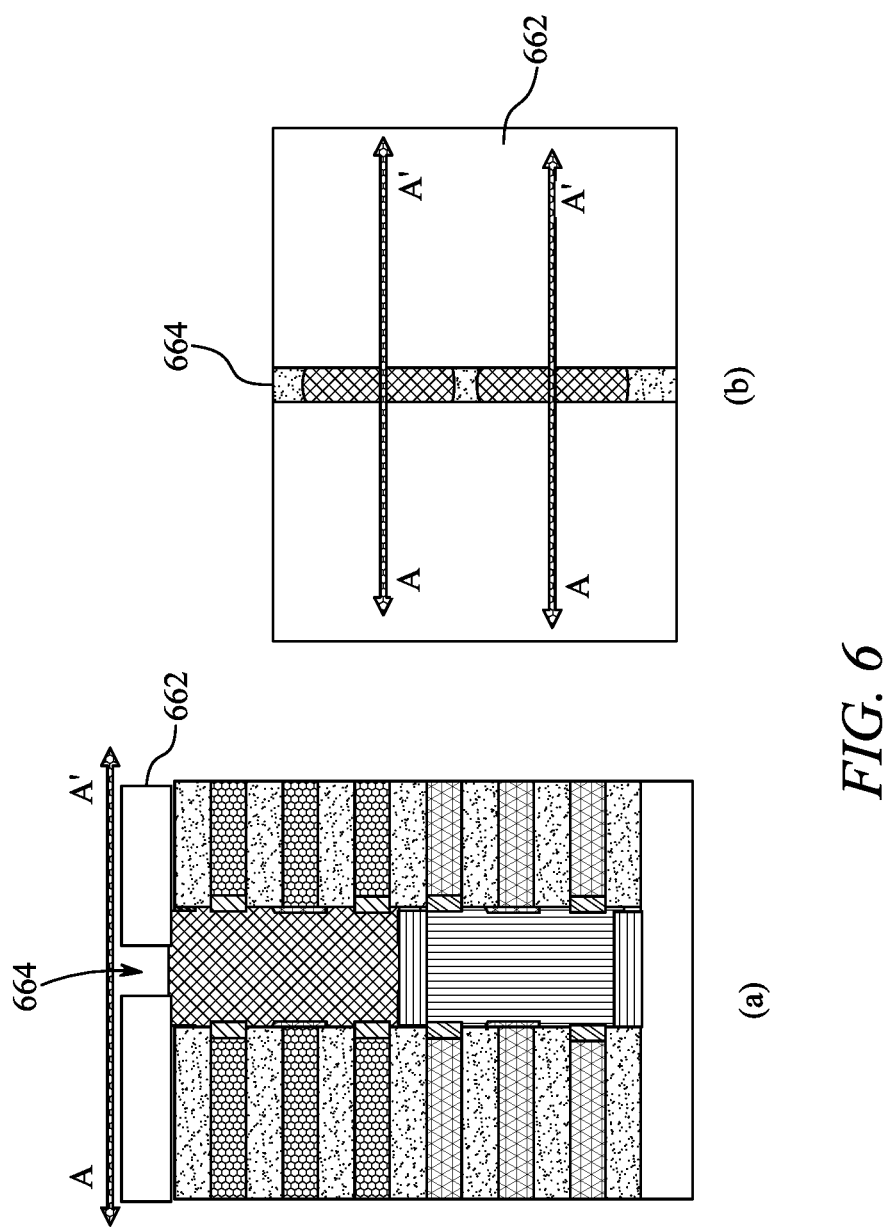
FIG. 6 illustrates a photoresist etch mask having an opening, where (a) shows the side cross-section and (b) shows the top view.

FIG. 6 shows a photoresist etch mask 662 having an opening 664 formed on top of the layer stack to divide the vertical channel structures into segments. In FIG. 6, (a) shows the side cross-section and (b) shows the top view.

Figure 7:
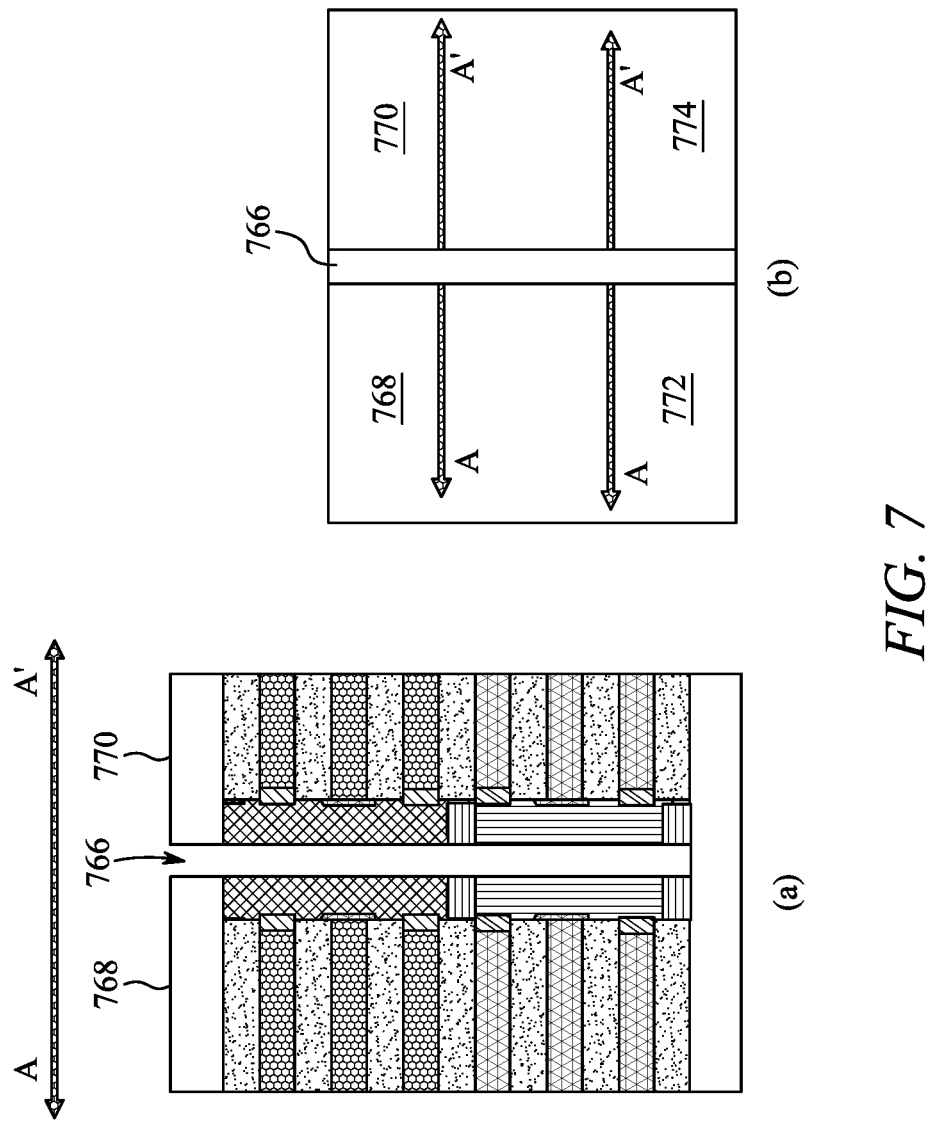
FIG. 7, (*a*) shows the layer stack segmented into two transistor stacks, and *b*) shows a top view of a segmented array of two vertical channel structure stacks.

In FIG. 7, (a) shows the layer stack segmented into two transistor stacks (768, 770) after a directional etch is completed through the vertical channel structure stack to segment the vertical channel structure stack into two stacks. In FIG. 7, (b) shows the top view of the segmented array of two vertical channel structure stacks, resulting in four vertical channel structure stacks 768, 770, 772, and 774 after the directional etch is completed. Vertical channel structure stacks 768 and 772 are isolated from vertical channel stacks 770 and 774 by air gap 766, and vertical channel stacks 768 and 770 are isolated from vertical channel stacks 772 and 774 each other by dielectric.

Figure 8:
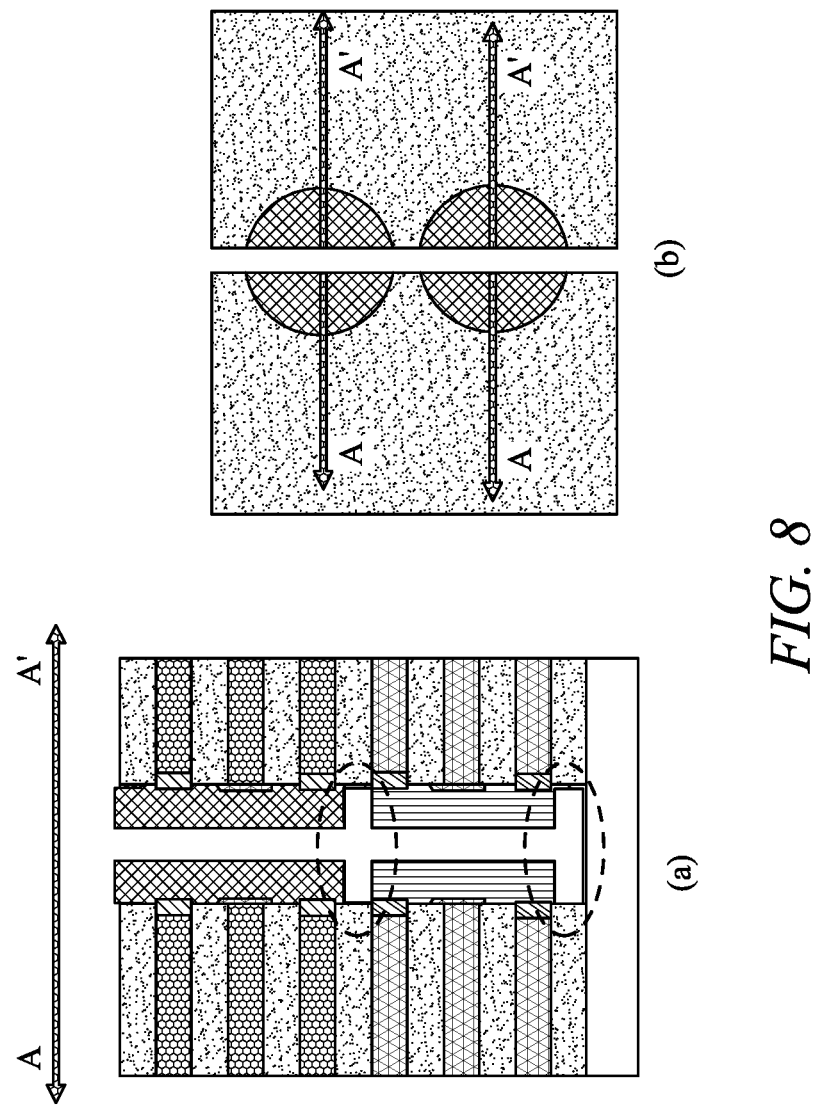
FIG. 8 illustrates the vertical channel structure stacks after isotropic removal of SiGe, where (a) represents the cross-sectional view and (b) shows the top view.

FIG. 8 illustrates the vertical channel structure stacks after isotropic removal of SiGe layers $112_1$ and $112_2$ in the area indicated by the dotted lines. This removal isolates the vertical channels from each other and from the underlying layer of semiconductor material. This enables air gap isolation as one aspect of the present disclosure. In FIG. 8, (a) represents the cross-sectional view and (b) shows the top view with an air gap between the segmented transistor stacks.

Figure 9:
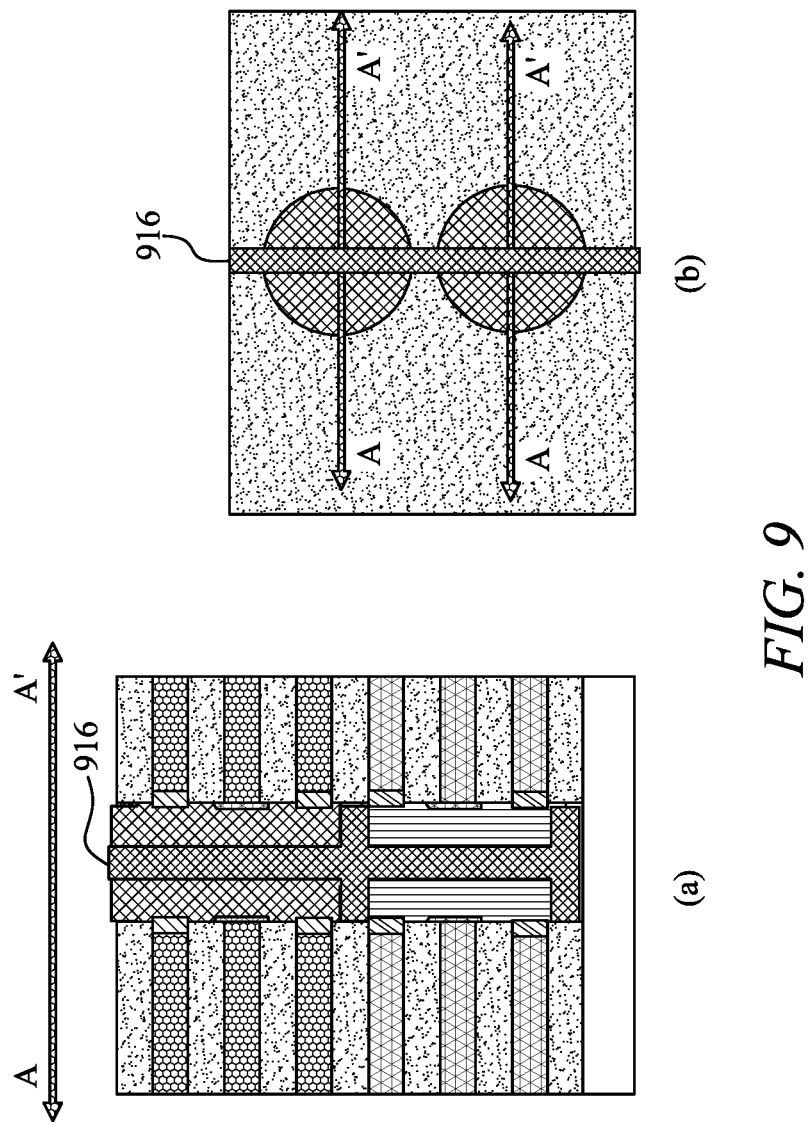
FIG. 9 shows an alternative option in which the air gap can be filled with high-k dielectric, where (a) shows a cross-sectional view and (b) shows a top view of two transistor stacks.

FIG. 9 shows an alternative option in which the air gap can be filled with high-k dielectric 916 to form 3D high-k dielectric isolation, or any other dielectric can be used. In FIG. 9, (a) shows a cross-sectional view and (b) shows a top view of two vertical channels which are isolated by high-k dielectric 916 to form four transistor stacks having two transistors within each stack.

Figure 10:
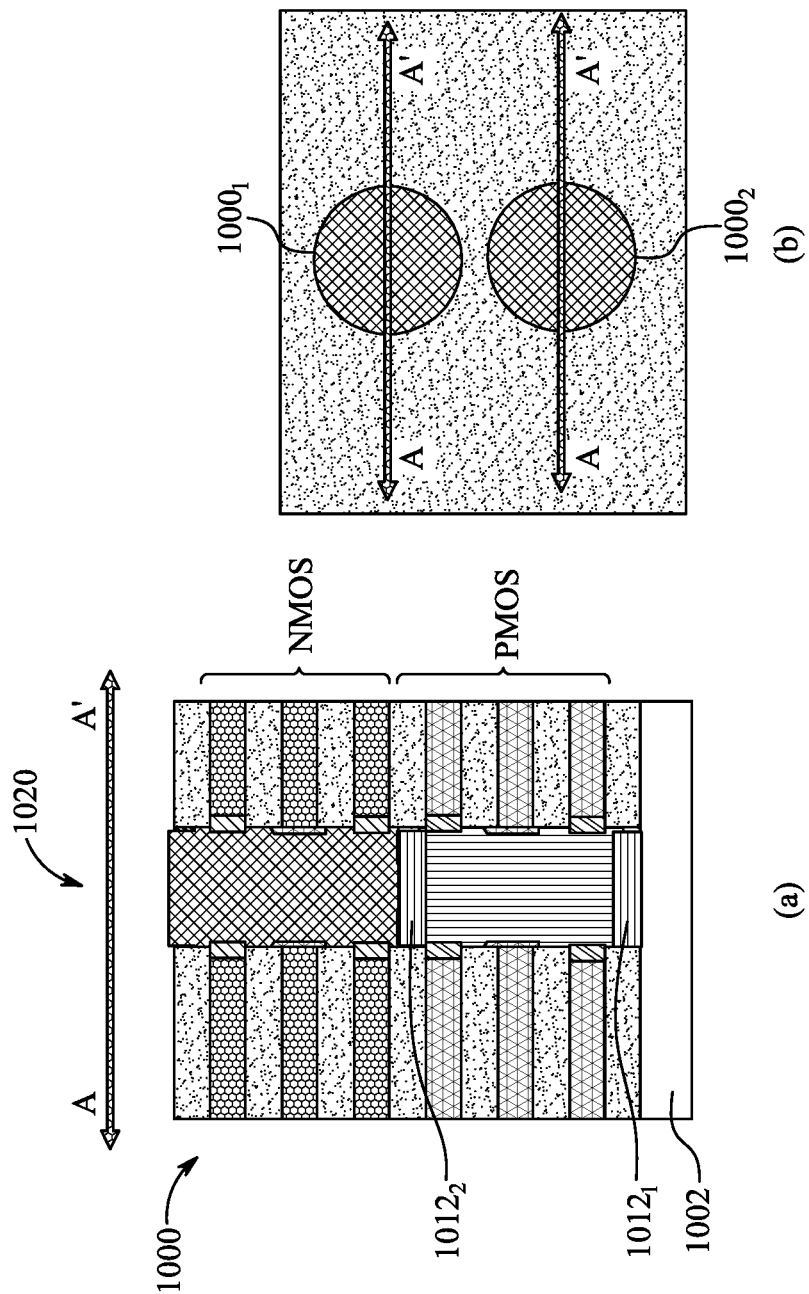
FIG. 10 illustrates a nearly finished transistor stack, where (a) is a cross-sectional view and (b) is a top view.

FIG. 10 to FIG. 14 show an alternative flow. FIG. 10 is similar to FIG. 5. This is a nearly completed, 3D vertical transistor 1000 having a vertical channel stack 1020 completed through salicidation of an NMOS transistor on top of a PMOS transistor in which 3D isolation is not yet completed. SiGe layers $1012_1$ and $1012_2$ are sacrificial layers for later isolation structures described below. In FIG. 10, (a) shows a cross-section taken along the line A-A' and (b) shows two vertical channel stacks $1000_1$ and $1000_2$, where each vertical channel structure stack has an example circular geometry, however, any shape vertical channel structure stack can be formed.

Figure 11:
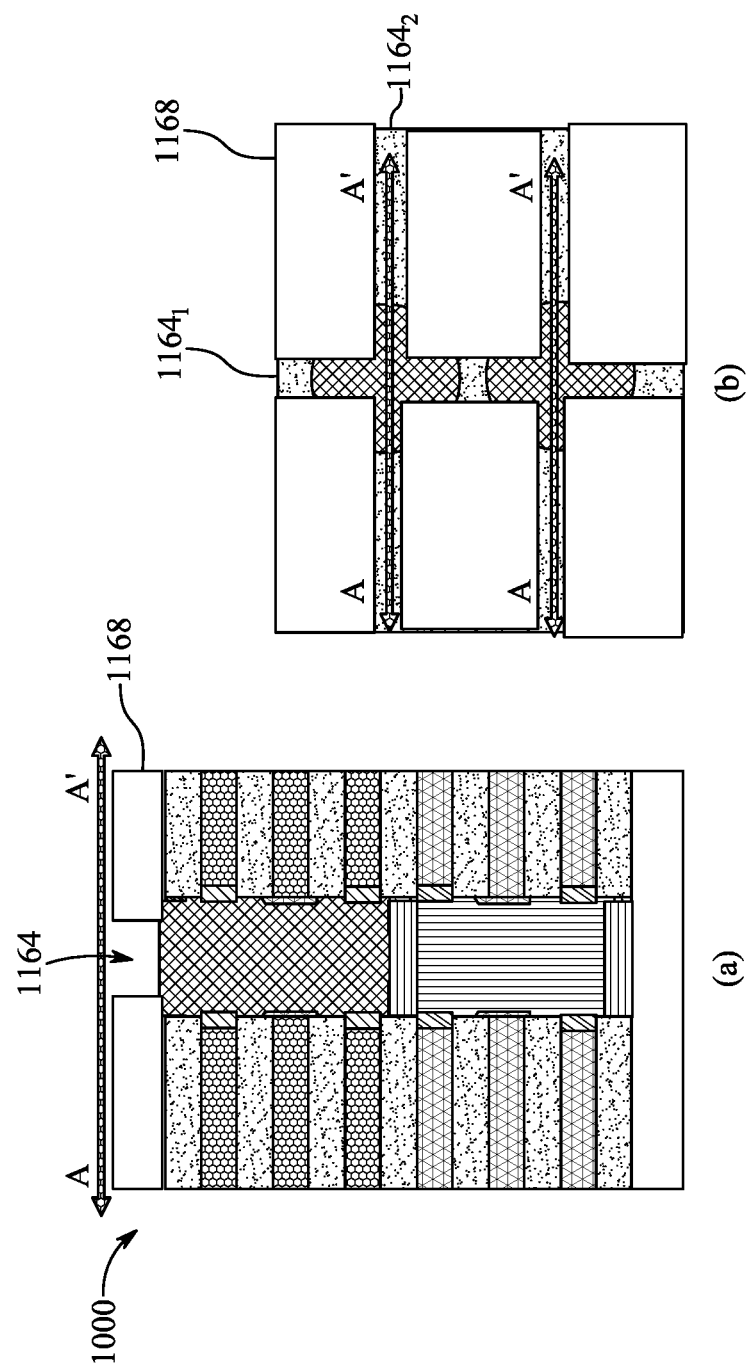
FIG. 11 shows an etch mask formed to quarter the transistor stack, where (a) is a cross-sectional view and (b) is a top view.

In FIG. 11, (a) shows an etch mask 1168 of photoresist formed on the layer stack with an opening to quarter the vertical channel stacks as shown in (b) along continuous cutting planes 1164₁ and 1164₂. Of course, illustrations are not necessarily drawn to scale and larger or smaller openings can be used.

Figure 12:
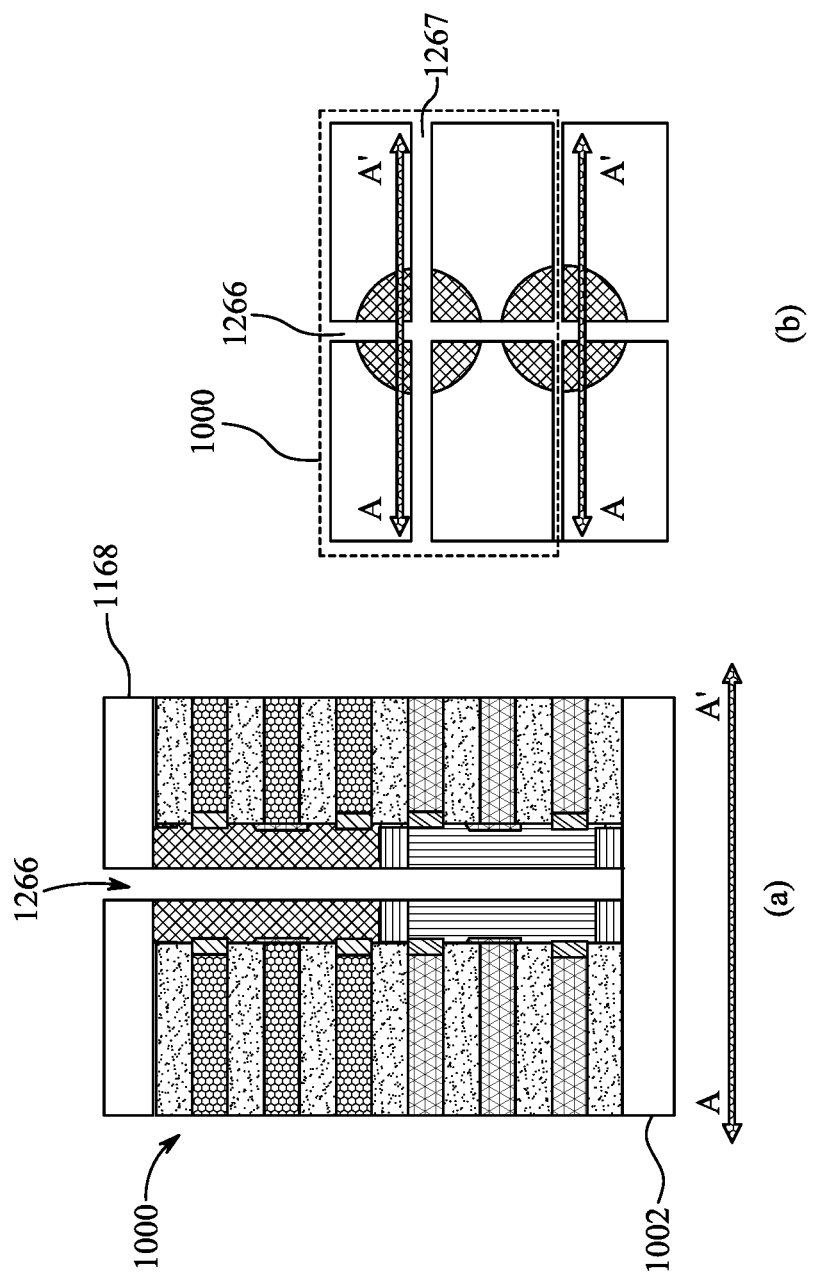
FIG. 12 shows a process step of etching a core in two planes through the vertical channel of the transistor stack, where (a) is a cross-sectional view and (b) is a top view.

FIG. 12 shows the openings 1266 and 1267 and a layer stack 1000 after directional etching through the etch mask 1168 of photoresist down to the silicon substrate 1002, segmenting each of the vertical channel stacks into four sections. In FIG. 12, (a) shows the cross-section of a single vertical channel structure stack 1000 and (b) shows a top view illustrating single vertical transistor channel stack 1000 segmented into four vertical channel transistor stacks with the etch mask 1168 removed.

Figure 13:
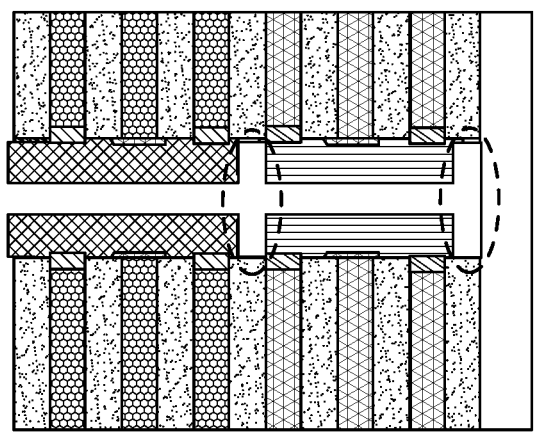
FIG. 13 shows a process step of removing isolating material.

In FIG. 13, the etch mask 1168 is removed followed by isotropic removal of SiGe for isolation in the area indicated by the dotted lines. This removal isolates the vertical channels from each other and from the underlying layer of semiconductor material. The initial transistor has been divided into four segments. Air gap isolation is one aspect of the present disclosure.

Figure 14:
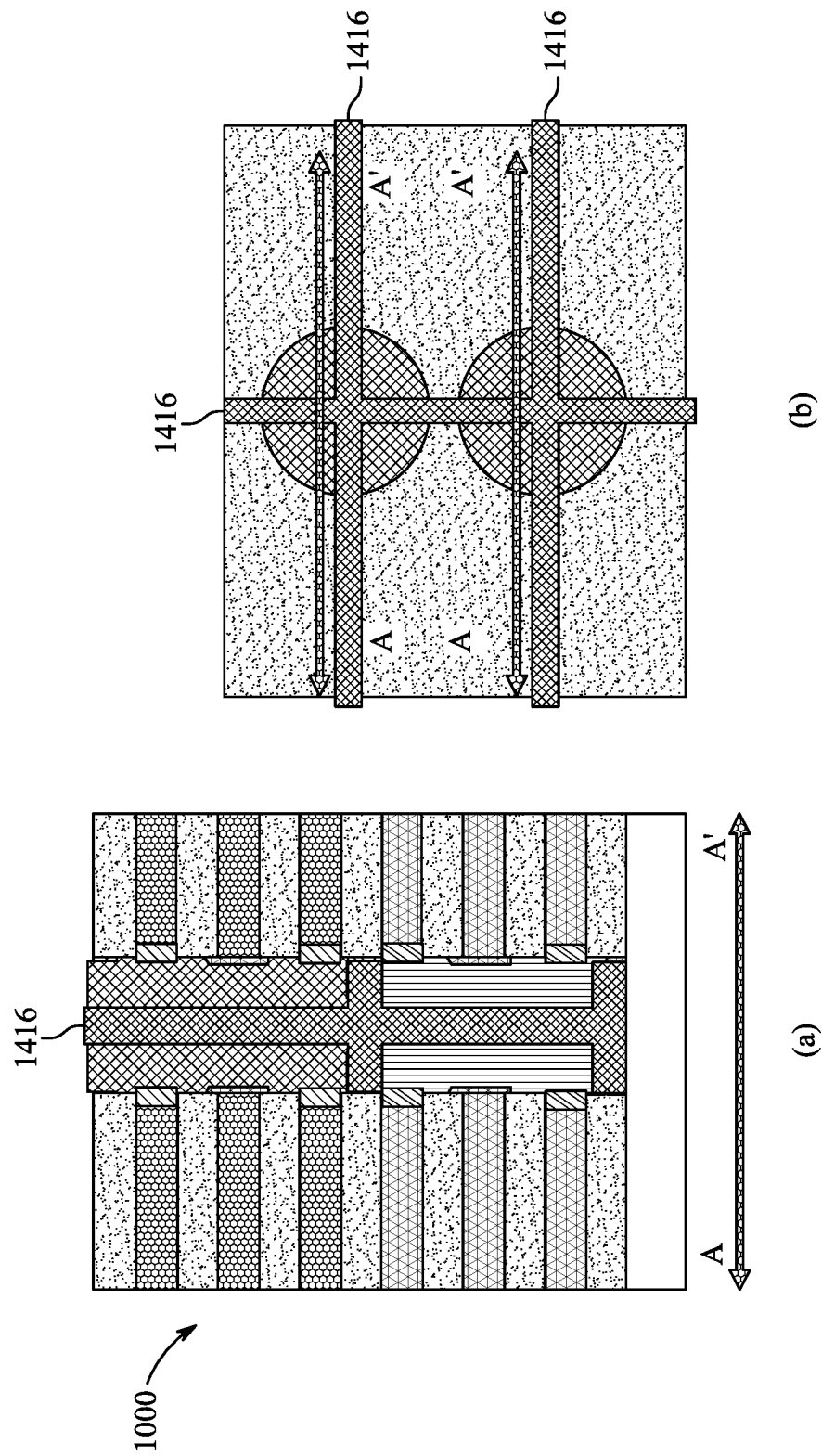
FIG. 14 shows a process step of filling the core with a high-k dielectric material, (a) is a cross-sectional view and (b) is a top view.

FIG. 14 shows an alternative option in which the air gap can be filled with high-k dielectric 1416 or other dielectric to form 3D high-k dielectric isolation, where (a) shows the cross-section of the vertical channel structure stack 1000 and (b) shows the high-k dielectric 1416 deposited between the segments.

FIG. 15 to FIG. 23 illustrate an example embodiment for two divisions starting with a cylindrical shell of epitaxially grown vertical channel structures with a dielectric core, and producing a pair of devices for 2 times increase in the number of transistors, starting with a nearly completed transistor that does not have isolation completed.

Figure 15:
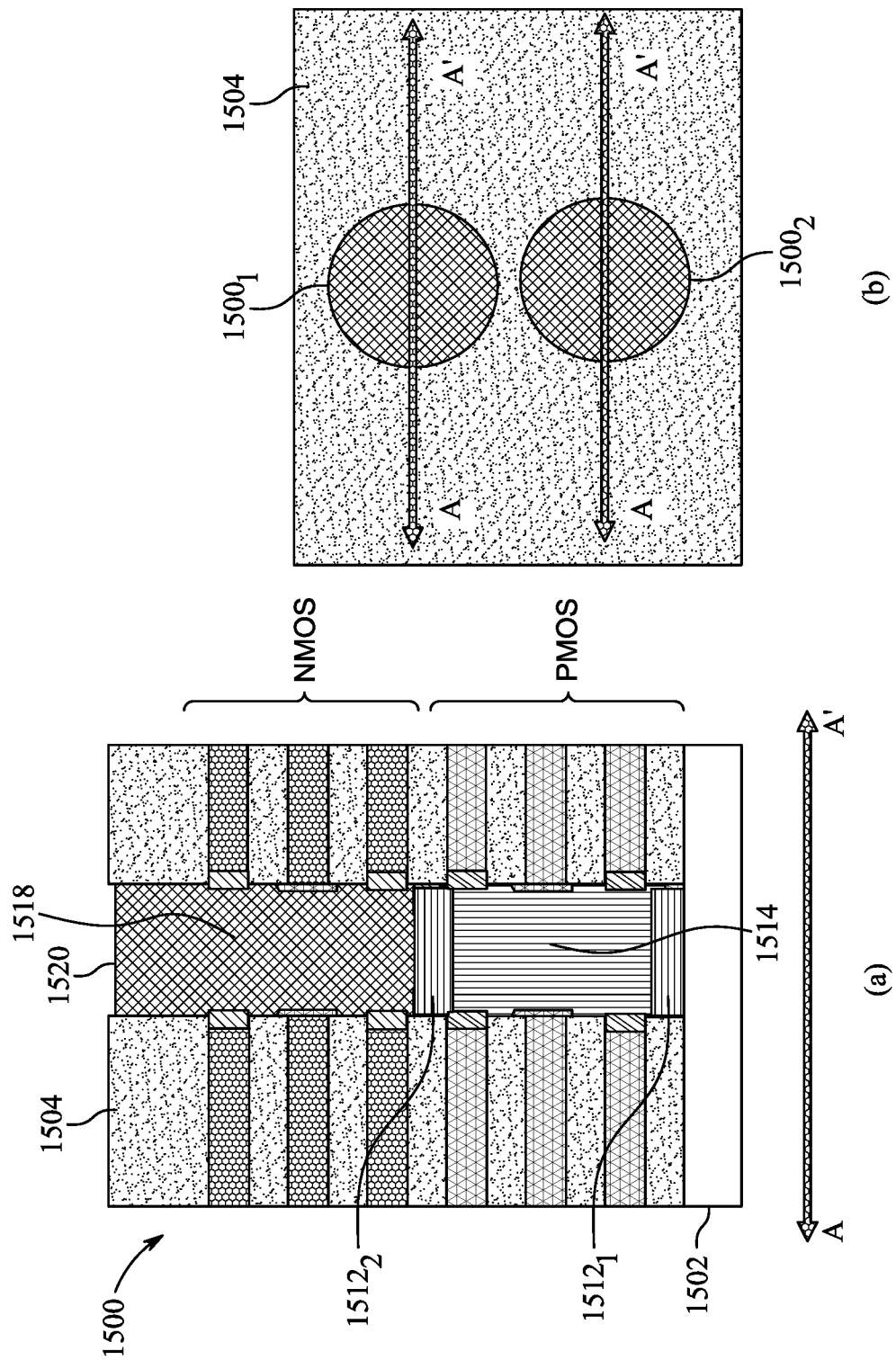
FIG. 15 illustrates a nearly finished transistor stack, where (a) is a cross-sectional view and (b) is a top view.

In FIG. 15, (a) shows a cross-sectional view of nearly completed transistor stack 1500 having vertical channel structure stack 1520, and (b) a top view showing an example of a substrate having two adjacent vertical channel structure stacks 1500₁ and 1500₂ surrounded by a layer of dielectric material 1504. The semiconductor structure substrate 1502 may have a plurality of nearly completed transistor stacks, but only two are shown for the sake of clarity. The nearly completed transistor stack includes a PMOS transistor having a p-silicon epitaxial region 1514 and an NMOS transistor having an n-silicon epitaxial region 1518 formed on a bulk silicon substrate 1502. SiGe layers 1512₁ and 1512₂ are sacrificial layers for later isolation described below.

Figure 16:
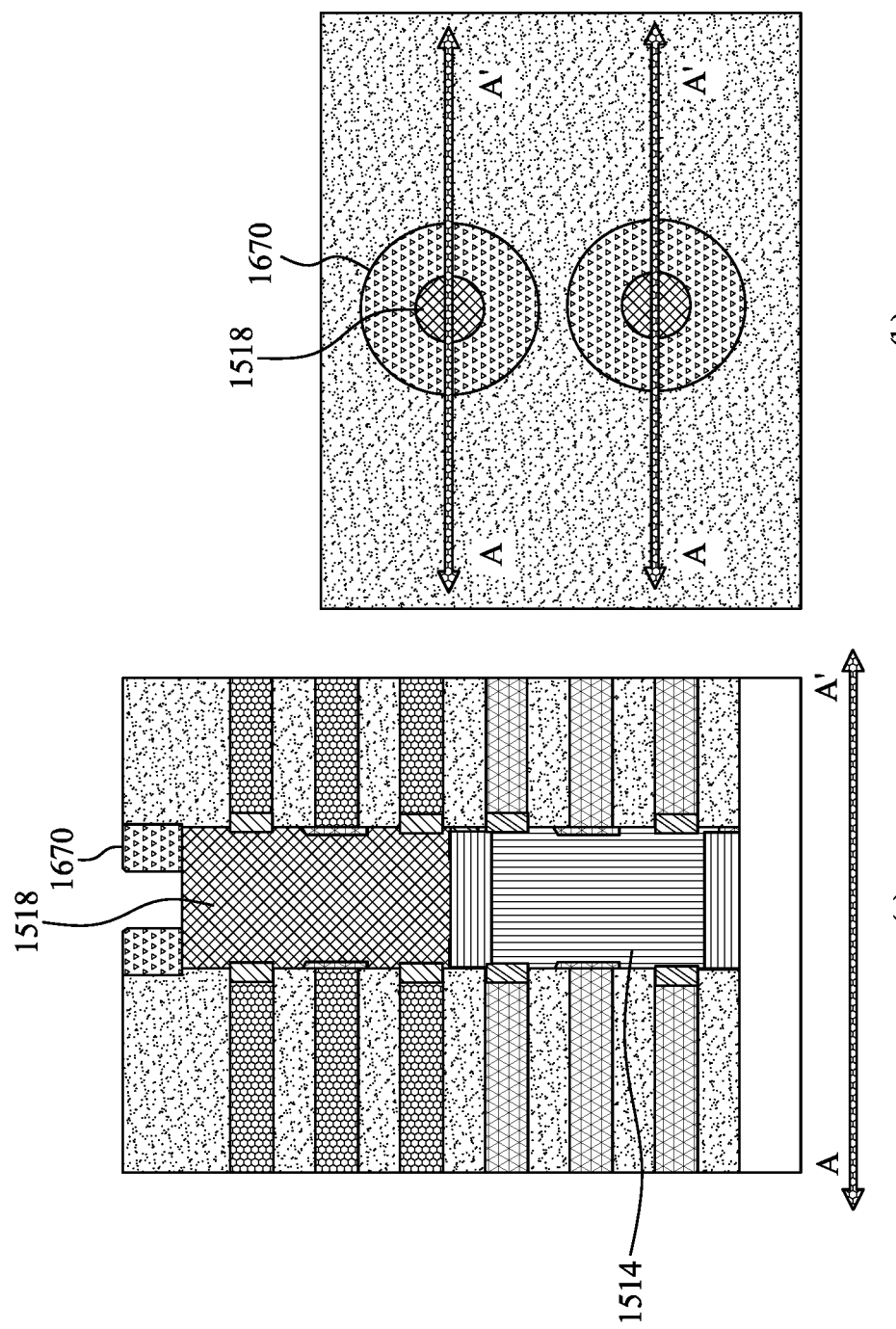
FIG. 16 illustrates a self-aligned etch mask, where (a) is a cross-sectional view and (b) is a top view.

In FIG. 16, a height of the n-silicon epitaxial region 1518 can be reduced and a self-aligned etch mask 1670 is formed in preparation for removing a core of the vertical channel structure stacks. For example, the self-aligned etch mask 1670 may be a conformal deposition of dielectric deposited over the n-silicon epitaxial material 1518, such as by atomic layer deposition (ALD). In FIG. 16, (a) shows a cross-section of the transistor stack along line A, A', and (b) shows a top view showing an example of a substrate having two vertical channel structure stacks with the self-aligned etch mask 1670.

Figure 17:
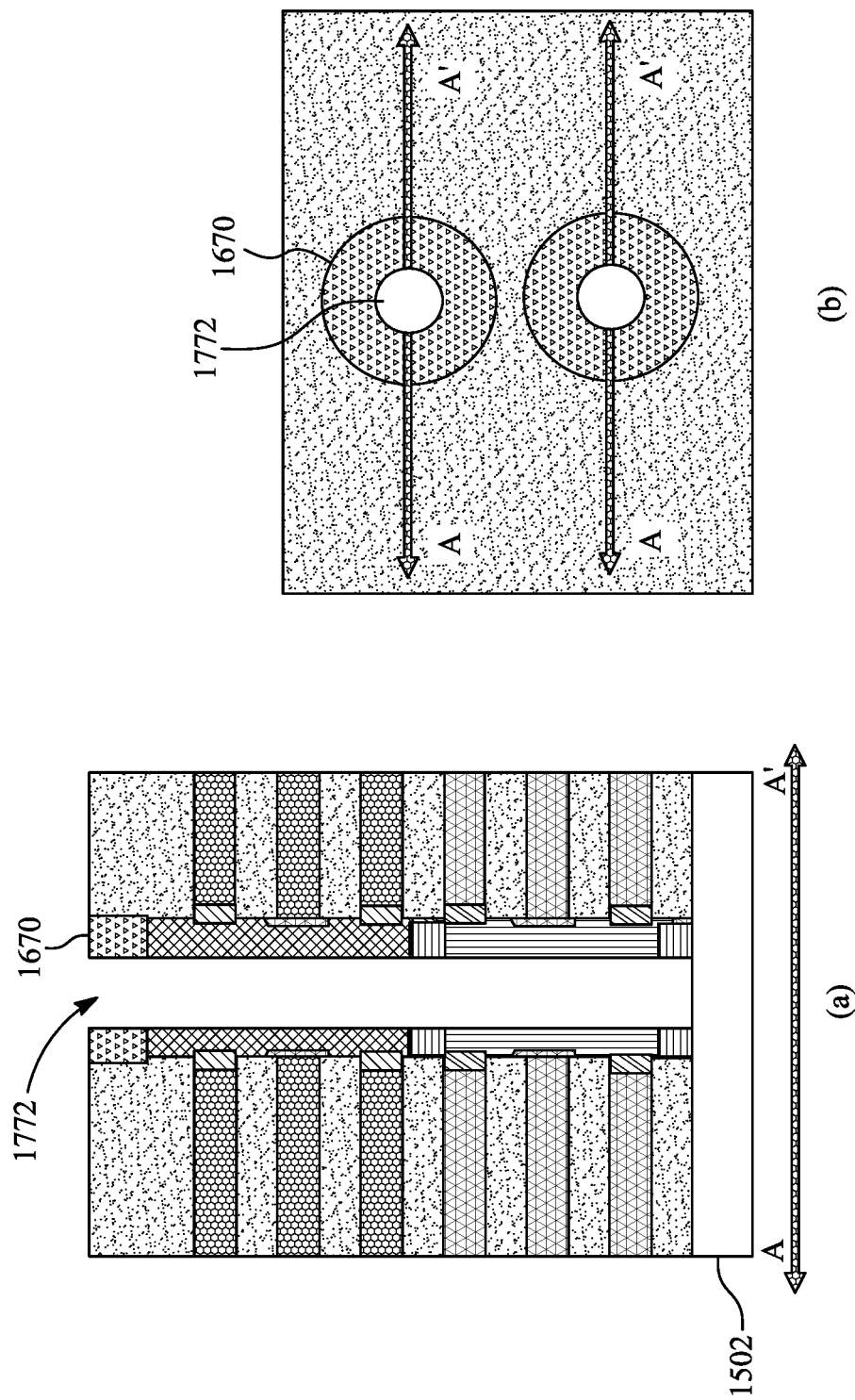
FIG. 17 illustrates a core etched in the vertical channel structure through the self-aligned etch mask, where (a) is a cross-sectional view and (b) is a top view.

As shown in FIG. 17, a directional etch back is executed through the vertical channel stack not protected by the self-aligned etch mask 1670 down to the silicon substrate 1502. The directional etch back is executed by removing the conformal material from horizontal surfaces while leaving sidewall depositions within the opening 1772 for the vertical channel structures. The result removes a core region of a lengthwise axis. This essentially creates sidewall spacers around a perimeter of the opening for the vertical channels. In FIG. 17, (a) shows a cross-section of the transistor stack along line A, A', and (b) shows a top view showing an example of a substrate having two vertical channel structure stacks with the core openings 1772.

Figure 18:
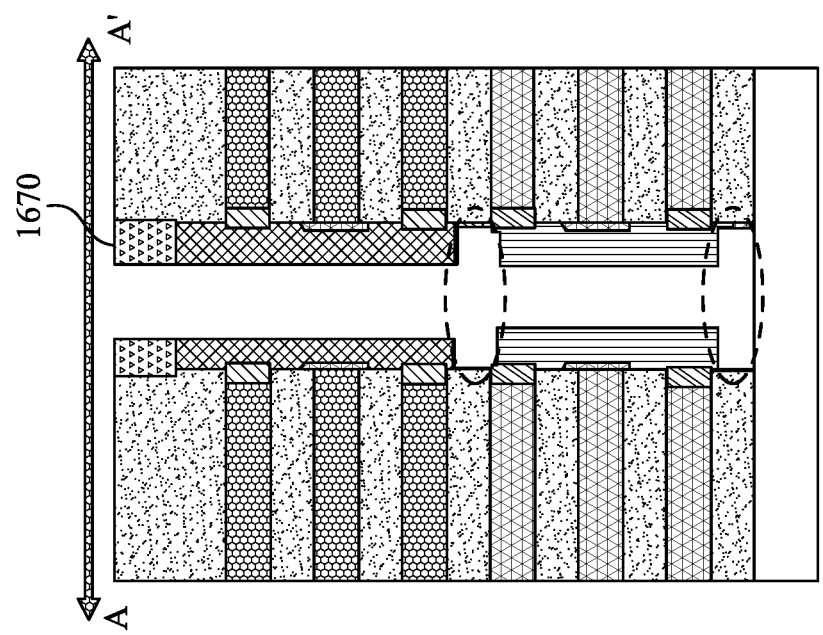
FIG. 18 illustrates the vertical channel structure stacks after isotropic removal of SiGe.

In FIG. 18, the SiGe material 1512₁ and 1512₂ (shown in FIG. 15) can be isotropically removed in the areas indicated by the dotted lines for device isolation. This removal isolates the vertical channels from each other and from the underlying layer of semiconductor material. The air gap isolation shown in FIG. 18 is one option disclosed herein for providing isolation.

Figure 19:
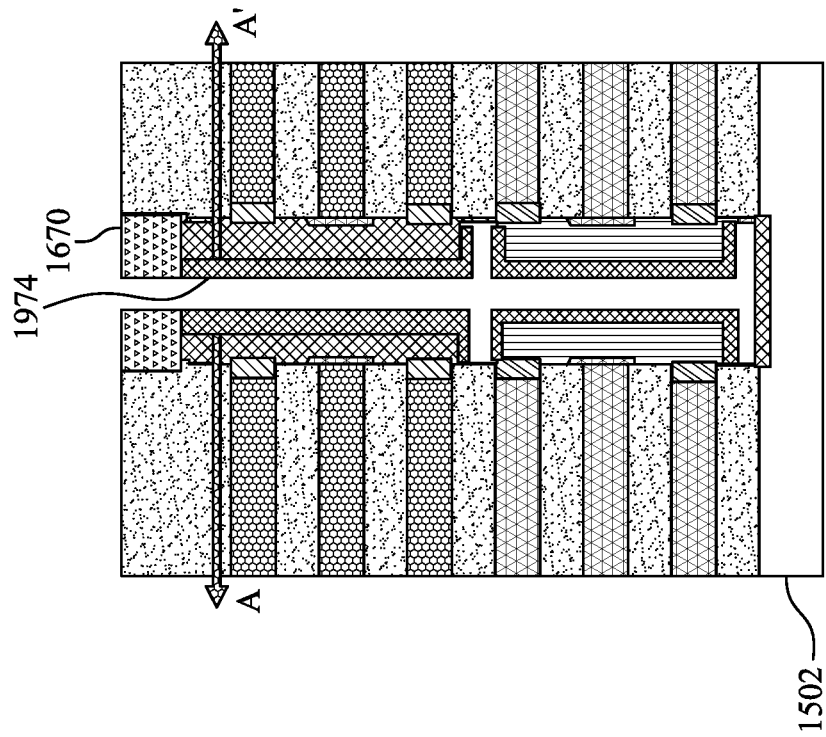
FIG. 19 illustrates a liner of high-k dielectric material formed over the exposed epitaxially grown silicon.

In FIG. 19, a high-k conformal deposition is executed to deposit high-k dielectric 1974 on uncovered surfaces of silicon regions (PMOS and NMOS and bulk silicon). The conformal layer of high-k dielectric 1974 is shown schematically for clarity, and all or a portion of the layer may extend into the region of the high-k dielectric material may extend into the region of the opening in the self-aligned etch mask 1670.

Figure 20:
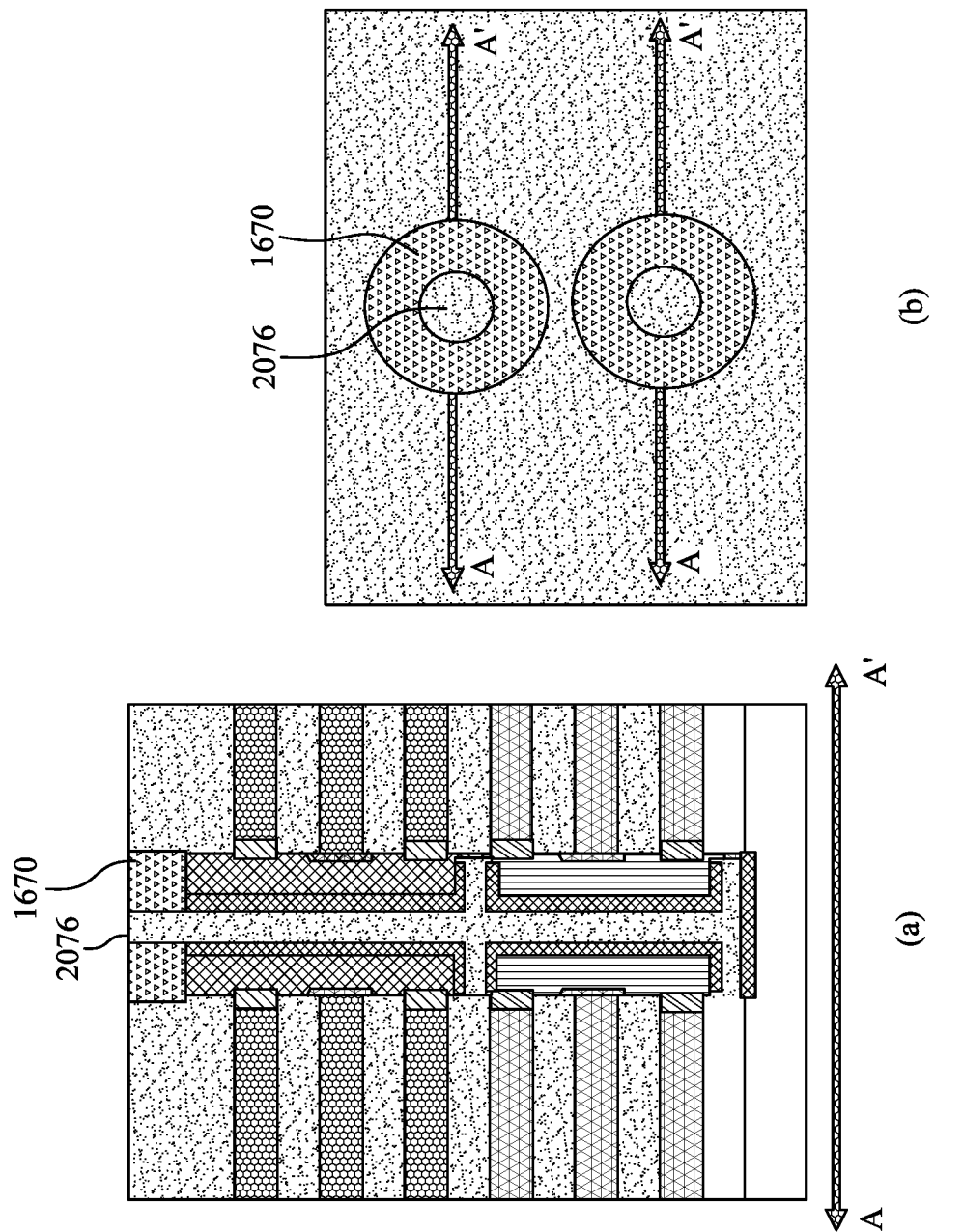
FIG. 20 illustrates the core filled with a dielectric material, where (a) is a cross-sectional view and (b) is a top view.

In FIG. 20, the cross-sectional view, (a) shows that the core regions and isolation gaps are filled with dielectric material 2076. In the top view, (b), a circular shell of n-silicon epitaxial material is hidden beneath the self-aligned etch mask 1670 of dielectric material.

Figure 21:
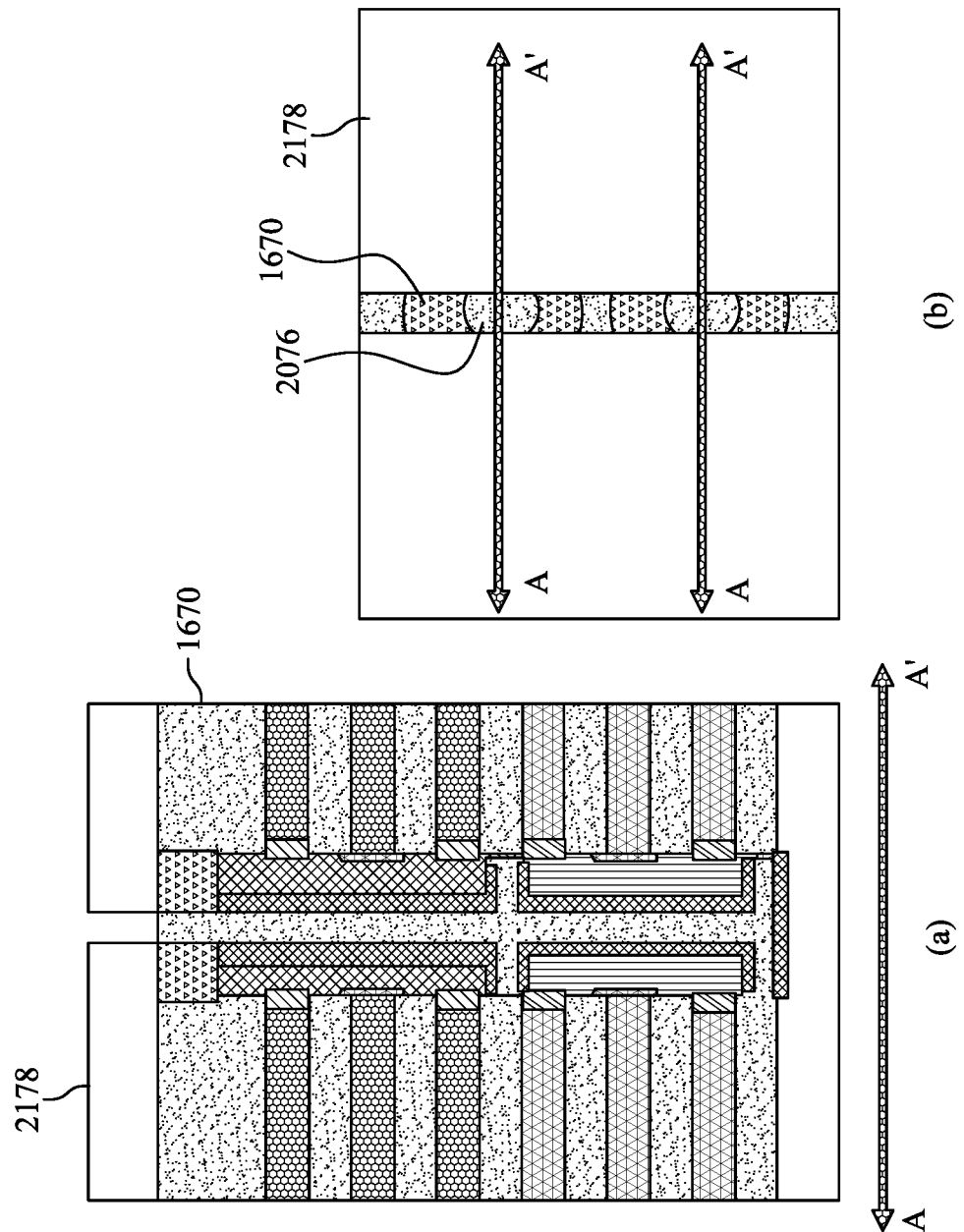
FIG. 21 illustrates an etch mask for segmenting the vertical channel structures into two sections, where (a) is a cross-sectional view and (b) is a top view.

In FIG. 21, the cross-sectional view (a) shows an etch mask 2178 formed on the substrate to divide the vertical device into two sections. The mask 2178 may provide for a selective directional etch that can etch the self-aligned etch mask 1670 of dielectric material and underlying shell of n-silicon epitaxial silicon material. The top view (b) shows the photoresist etch mask 2178 open to the ring of the self-aligned etch mask 1670 of dielectric material and the core of dielectric material 2076. The opening may be larger or smaller than shown in FIG. 21. Note that etching chemistries can be changed as the etch process progresses to etch whichever material is uncovered to be etched. Such chemistries and techniques are generally known in the semiconductor fabrication industry.

Figure 22:
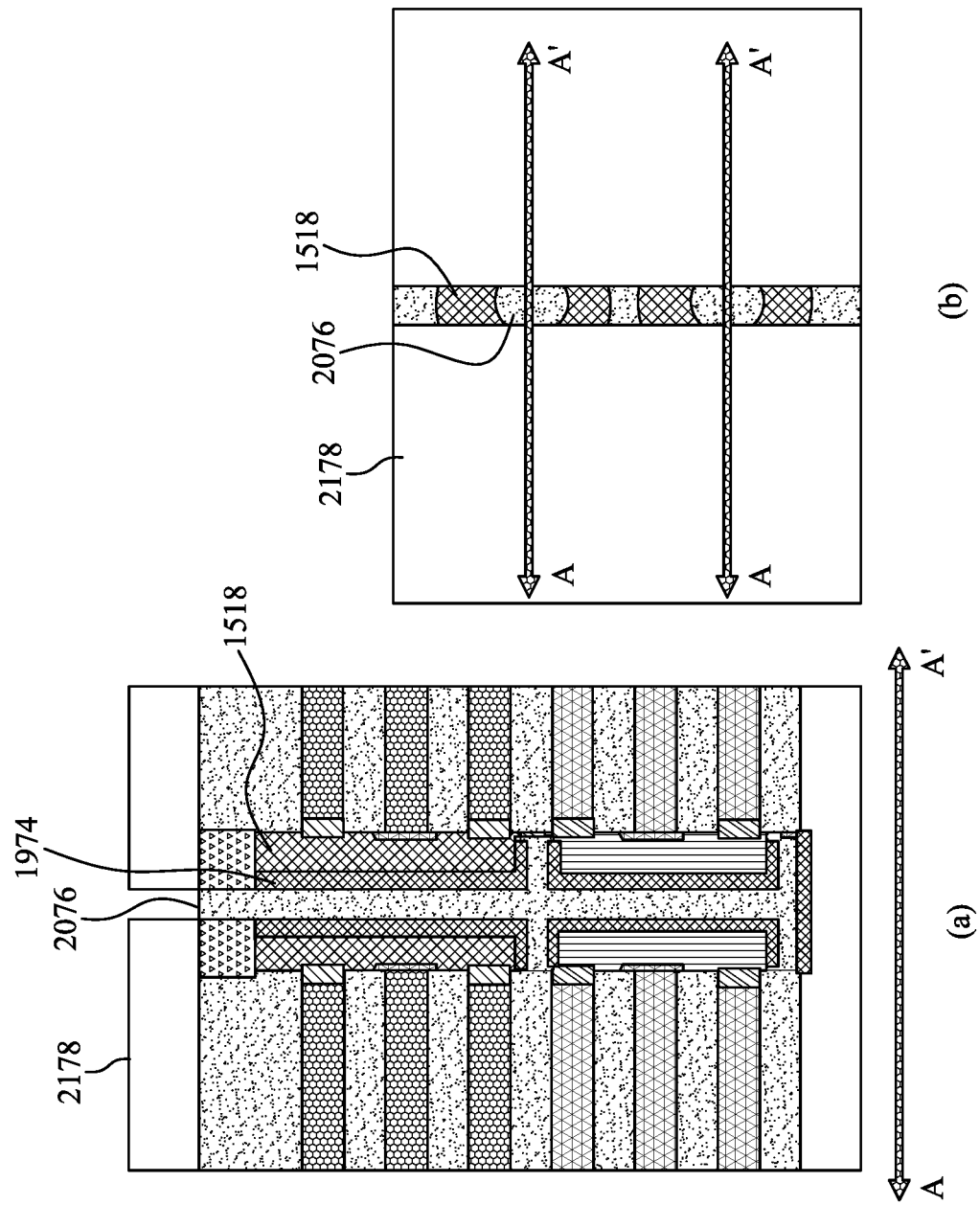
FIG. 22 illustrates removal of the self-aligned etch mask, where (a) is a cross-sectional view and (b) is a top view.

FIG. 22 shows portions of the perimeter mask ring of the self-aligned etch mask 1670 of dielectric material removed by the selective directional etch. In the example embodiment, the dielectric material 2076 and the high-k liner 1974 are left untouched by the directional etch as shown in view (a). The top view (b) shows the etch mask 2178 open to the n-silicon epitaxial region 1518 and the core of dielectric material 2076. The high-k liner 1974 is not shown in the top view. This divides the original transistor stack 1500 of FIG. 15 into two transistor stacks.

Figure 23:
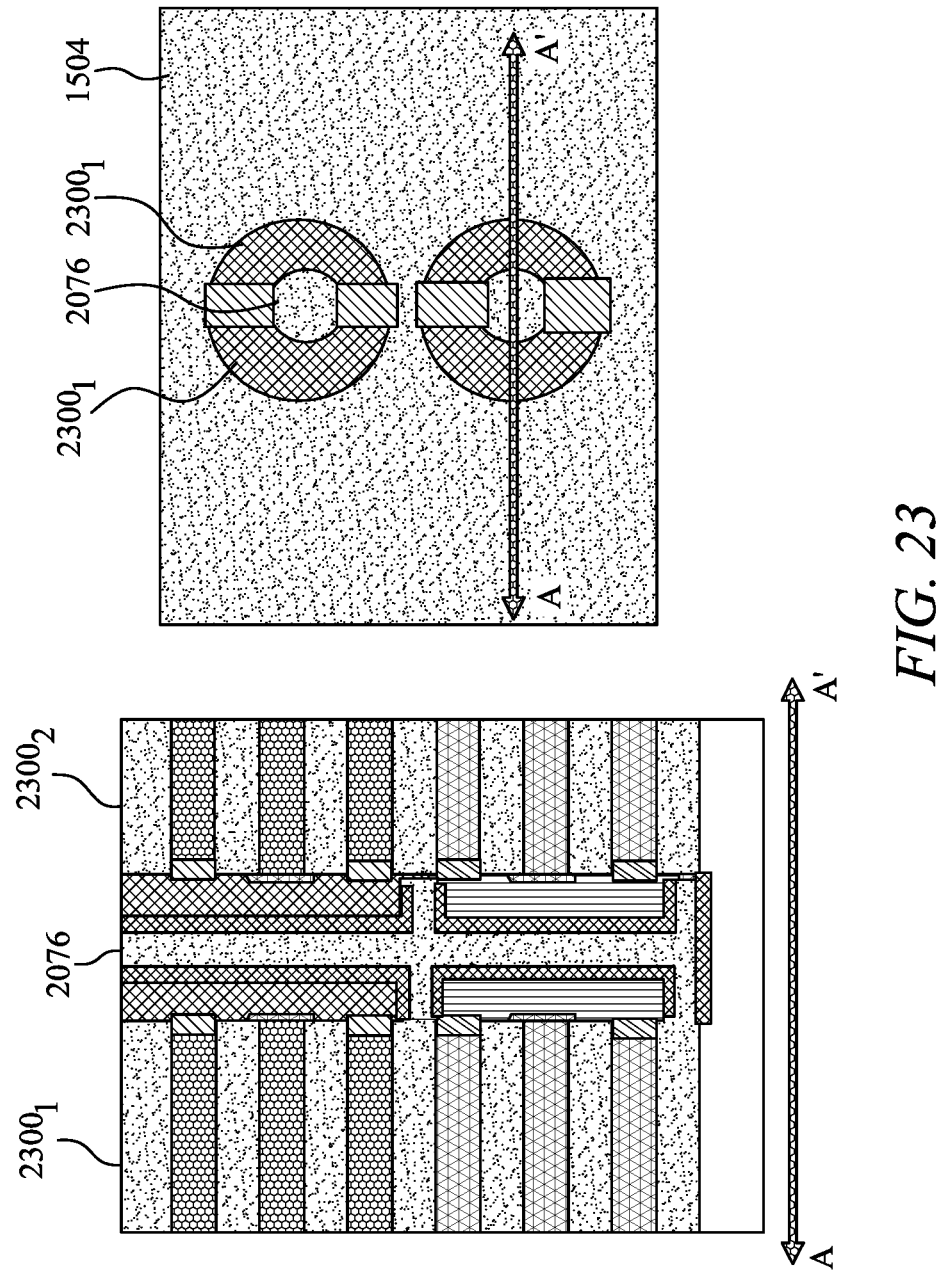
FIG. 23 illustrates the segmented transistor stacks after the etch mask is removed, where (a) is a cross-sectional view and (b) is a top view.

FIG. 23 shows the resulting vertical arc-shaped channel structures. The photoresist etch mask is removed as well as other masking dielectrics. Note that routing between device regions is enabled in some embodiments because just the silicon regions can be selectively etched. The cross-sectional view (a) shows that the original vertical channel structure stack 1520 has been divided into two vertical channel structure stacks 2300₁ and 2300₂, isolated from each other by dielectric material 2076. The top view (b) shows that the original two vertical channel substrate stacks 1501₁ and 1501₂ have been divided so that each of the vertical channel substrate stacks is now two arc shaped stacks, surrounded by dielectric layer 1504 and having a core of dielectric material 2076. Portions of the original epitaxial shell that were removed to form the arc shapes have been filled with additional dielectric material which is different from the dielectric 2076.

The processes shown above illustrate the construction of vertical segments VFETs and the construction of NMOS and PMOS devices with 3D side by side CMOS and also CFET CMOS designs. The processes illustrate a basic building block for 3D segmented VFET transistor stacks being one transistor stack tall, which can be extended to T transistors tall, where T is limited only by structural considerations, such as structural stability, channel thickness, quantum effects, and the like. Further, the processes shown allow the ability to precisely generate additional 3D vertical channel modified regions self-aligned to vertical nano sheets in different regions of stacked 3D transistors.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of microfabrication, the method comprising:
   forming a layer stack on a substrate, the layer stack including alternating layers of a metal and a first dielectric material;
   forming openings in the layer stack that extend vertically through the layer stack and uncover an underlying layer of semiconductor material;
   forming vertical channel structures extending through the openings of the layer stack, the vertical channel structures formed by epitaxial growth, the vertical channel structures each having a current flow path that is perpendicular to a surface of the substrate;
   segmenting each of the vertical channel structures lengthwise into a plurality of vertical channel structure segments, each vertical channel structure segment having a current flow path that is perpendicular to the surface of the substrate; and
   using portions of the layers of the metal to electrically connect to the vertical channel structure segments.

2. The method of claim 1, wherein the forming vertical channel structures extending through openings of the layer stack includes forming stacks of vertical channel structures positioned over each other in a direction perpendicular to the surface of the substrate.

3. The method of claim 1, wherein the portions of the layers of the metal are used to form source/drain contacts and gate contacts to each vertical channel structure segment, with source/drain contacts positioned above and below a respective gate contact for forming the current flow path that is perpendicular to the surface of the substrate.

4. A method of microfabrication, the method comprising:
   forming an initial vertical channel structure of semiconductor material protruding from a surface of a substrate such that the initial vertical channel structure has a current flow path that is perpendicular to the surface of the substrate; and
   segmenting the initial vertical channel structure lengthwise into a plurality of independent vertical channel structure segments, each vertical channel structure segment having a respective current flow path that is perpendicular to the surface of the substrate.

5. The method of claim 4, wherein the forming an initial vertical channel structure comprises epitaxially growing a solid core of silicon-containing material from the substrate surface as the initial vertical channel structure.

6. The method of claim 4, wherein the forming an initial vertical channel structure comprises:
   epitaxially growing a solid core of silicon-containing material from the substrate surface, and
   etching a core opening contained within an inner portion of the solid core to form a shell of silicon-containing material as the initial vertical channel structure.

7. The method of claim 6, further comprising forming a conformal layer of high-k dielectric material within the core opening.

8. The method of claim 4, further comprising forming an initial gate structure on the initial vertical channel structure, wherein the segmenting further comprises segmenting the initial gate structure lengthwise into a plurality of gate structure segments associated with the plurality of vertical channel structure segments respectively.

9. The method of claim 8, wherein the forming the initial gate structure comprises forming the initial gate structure at an intermediate stage of epitaxially growing the initial vertical channel structure.

10. The method of claim 4, further comprising forming an initial source/drain contact for the initial vertical channel structure, wherein the segmenting further comprises segmenting the initial source/drain contact lengthwise into a plurality of source/drain contact segments associated with the plurality of vertical channel structure segments respectively.

11. The method of claim 10, wherein the forming the initial source/drain contact comprises forming the initial source/drain contact at an intermediate stage of epitaxially growing the initial vertical channel structure.

12. The method of claim 4, further comprising forming an initial isolation structure which separates the initial vertical channel structure from the substrate, wherein the segmenting further comprises segmenting the initial isolation structure lengthwise into a plurality of isolation structure segments each separating a respective vertical channel structure segment from the substrate.

13. The method of claim 12, wherein the segmenting comprises directionally etching a division opening lengthwise through the initial vertical channel structure and the initial isolation structure to expose a portion of the substrate beneath the initial vertical channel structure, wherein the division opening segments the initial vertical channel structure and the initial isolation structure into the plurality of isolation structure segments each separating a respective vertical channel structure segment from the substrate.

14. The method of claim 13, further comprising isotropically etching each of the isolation segments through the division opening to form an isolation air gap which separates each of the vertical channel structure segments from the substrate.

15. The method of claim 14, further comprising filling the division opening and the isolation air gap with dielectric material which separates each of the vertical channel structure segments from the substrate.

16. The method of claim 4, wherein:
the forming an initial vertical channel structure comprises forming an initial stack of vertical channel structures comprising a plurality of initial vertical channel structures stacked in the direction perpendicular to the surface of the substrate, and
the segmenting comprises segmenting the initial stack of vertical channel structures lengthwise into a plurality of segmented stacks of vertical channel structures.

17. The method of claim 16, further comprising forming an initial isolation structure for the initial stack of vertical channel structures, wherein the segmenting further comprises segmenting the initial isolation structure lengthwise into a plurality of segmented isolation structures each corresponding to a respective segmented stack of vertical channel structures.

18. The method of claim 17, wherein:
the initial isolation structure comprises a first isolation portion which separates the plurality of initial vertical channel structures from each other, and a second isolation portion which separates the initial stack of vertical channel structures from the substrate, and
the segmenting the initial isolation structure comprises segmenting each of the first and second isolation portions into first portion segments which separate the vertical channel structures of a respective segmented stack from each other, and second portion segments which separate a respective segmented stack of vertical channel structures from the substrate.

19. The method of claim 18, wherein:
the segmenting compises directionally etching a division opening lengthwise through the initial vertical channel structure and the initial isolation structure to expose a portion of the underlying substrate, and
the method further comprising isotropically etching each of the isolation segments through the division opening to form a first isolation air gap from the first isolation portion and a second isolation air gap from the second isolation portion.

20. The method of claim 19, further comprising filling the division opening, the first isolation air gap, and the second isolation air gap with dielectric material to separate all of the vertical channel structure segments from the substrate and to separate all of the segmented vertical channel structures from each other.

* * * * *

UNITED STATES PATENT AND TRADEMARK OFFICE
CERTIFICATE OF CORRECTION

| | | |
|---|---|---|
| PATENT NO. | : 12,218,011 B2 | Page 1 of 1 |
| APPLICATION NO. | : 17/521279 | |
| DATED | : February 4, 2025 | |
| INVENTOR(S) | : Gardner et al. | |

It is certified that error appears in the above-identified patent and that said Letters Patent is hereby corrected as shown below:

On the Title Page

Column 1, in Item (72), under "Inventors", Line 1, after "Mark" insert -- I. --.

In the Claims

In Column 14, Claim 19, Line 21, delete "compises" and insert -- comprises --, therefor.

Signed and Sealed this
Twenty-second Day of April, 2025

Coke Morgan Stewart
*Acting Director of the United States Patent and Trademark Office*